United States Patent
Maruyama

(10) Patent No.: US 7,437,646 B2
(45) Date of Patent: Oct. 14, 2008

(54) TEST PATTERN GENERATING METHOD AND APPARATUS AND STORING MEDIUM FOR STORING TEST PATTERN GENERATING PROGRAM

(75) Inventor: Daisuke Maruyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 636 days.

(21) Appl. No.: 10/965,766

(22) Filed: Oct. 18, 2004

(65) Prior Publication Data
US 2005/0289425 A1 Dec. 29, 2005

(30) Foreign Application Priority Data
Jun. 29, 2004 (JP) ............... 2004-191718

(51) Int. Cl.
*G01R 31/28* (2006.01)
(52) U.S. Cl. .................................... 714/738
(58) Field of Classification Search ............... 714/728, 714/738
See application file for complete search history.

(56) References Cited

U.S. PATENT DOCUMENTS

| | | | | |
|---|---|---|---|---|
| 4,716,564 A | * | 12/1987 | Hung et al. ............... | 714/738 |
| 5,390,193 A | * | 2/1995 | Millman et al. ............ | 714/741 |
| 5,410,552 A | * | 4/1995 | Hosokawa .................. | 714/738 |
| 5,958,077 A | * | 9/1999 | Banerjee et al. ............ | 714/738 |
| 6,425,104 B1 | * | 7/2002 | Toumiya ..................... | 714/738 |
| 6,618,117 B2 | * | 9/2003 | Silverbrook ................ | 355/18 |
| 6,658,635 B1 | * | 12/2003 | Tanimoto .................... | 716/6 |
| 7,296,249 B2 | * | 11/2007 | Rinderknecht et al. ...... | 716/4 |

FOREIGN PATENT DOCUMENTS

JP 11052030 2/1999

* cited by examiner

*Primary Examiner*—James C Kerveros
(74) *Attorney, Agent, or Firm*—Staas & Halsey LLP

(57) ABSTRACT

The present invention is a test pattern generating method. And the test pattern generating method provides a counting step for counting the number of faults becoming undetectable respectively, at each of states 0 and 1 that are able to be given to each of input pins of EOR gates when each of the EOR gates becomes a D frontier (different frontier) or a J frontier (justify frontier), a selecting step for selecting a state in which the number of faults becoming undetectable is smaller in the 0 and 1 states as an allocating state to the input pin, based on a counted result at the counting step, and step for generating the test pattern based on a selected state at the selecting step. With this, dynamic compaction can be effectively executed by restraining the increase of the number of test patterns.

17 Claims, 18 Drawing Sheets

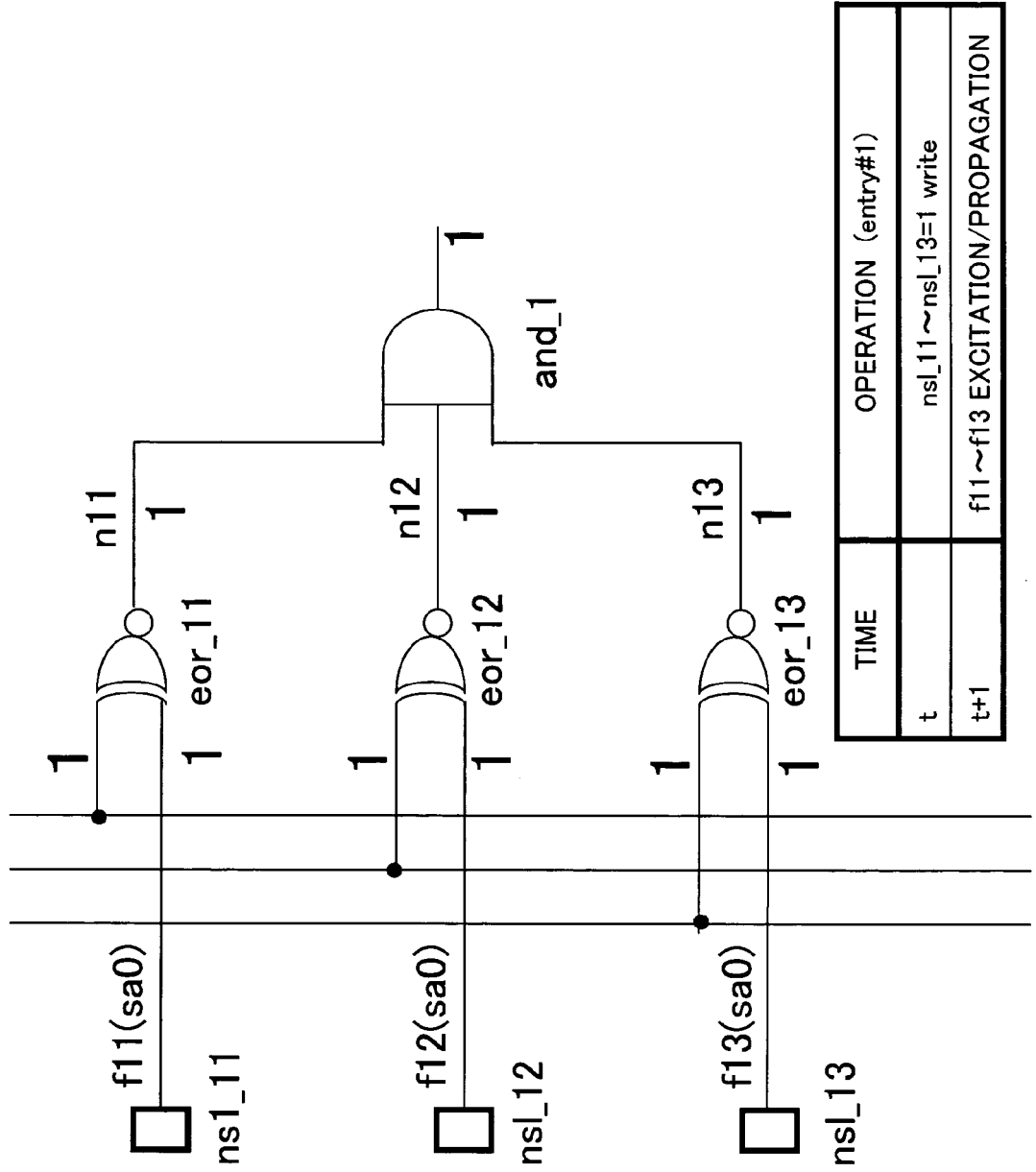

FIG. 16

| TIME | OPERATION |
|---|---|
| t | nsl_11~nsl_13=1 write |
| t+1 | f11~f13 EXCITATION/PROPAGATION |

FIG. 17

| TIME | OPERATION | | | |
|---|---|---|---|---|
| t | ns1_11=1 write | | | |
| t+1 | f11 EXCITATION/ PROPAGATION | ns1_12=1 write | | |
| t+2 | | f12 EXCITATION/ PROPAGATION | ns1_13=1 write | |
| t+3 | | | f13 EXCITATION/ PROPAGATION | |

FIG. 18

| TIME | OPERATION (entry#1) | OPERATION (entry#2) |
|---|---|---|
| t | nsl_11~nsl_13=1 write | |
| t+1 | f11~f13 EXCITATION/PROPAGATION | nsl_21~nsl_23=1 write |
| t+2 | | f21~f23 EXCITATION/PROPAGATION |

FIG. 19

| TIME | OPERATION (entry#1) | | | OPERATION (entry#2) | | |
|---|---|---|---|---|---|---|
| t | nsl_11=1 write | | | | | |
| t+1 | f11 EXCITATION/ PROPAGATION | nsl_12=1 write | | | | |
| t+2 | | f12 EXCITATION/ PROPAGATION | nsl_13=1 write | | | |
| t+3 | | | f13 EXCITATION/ PROPAGATION | nsl_21=1 write | | |
| t+4 | | | | f21 EXCITATION/ PROPAGATION | nsl_22=1 write | |
| t+5 | | | | | f22 EXCITATION/ PROPAGATION | nsl_23=1 write |
| t+6 | | | | | | f23 EXCITATION/ PROPAGATION |

TEST PATTERN GENERATING METHOD AND APPARATUS AND STORING MEDIUM FOR STORING TEST PATTERN GENERATING PROGRAM

BACKGROUND OF THE INVENTION

1. Field of the Invention

The present invention relates to a technology adapted for generating a test pattern for detecting faults in an electronic circuit such as an LSI (Large Scale Integration).

2. Description of the Related Art

Detection of manufacturing failure of electronic circuits, such as LSI (Large Scale Integration) and the like, due to its manufacturing is in general performed by applying an appropriate signal value, by means of tester, to an input pin of the LSI and a signal value appearing at an output pin is compared with an expected result. Here, the signal value applied to the input pin and the expected value that should appear at the output pin are collectively called a test pattern.

The defects occurring in the LSI during its manufacturing is called faults, and in order to verify all of the faults occurring in the LSI, many test patterns are required. And in order to decrease the number of these test patterns, a compaction method called as a dynamic compaction method is generally utilized (refer to patent literature 1 mentioning later).

As explained below, the dynamic compaction is said to be a compaction process for test data. For example, when a test for a primary fault on a target is successful with a test pattern generated by an ATPG (Automatic Test Pattern Generator), one secondary fault is selected in a set of remaining undetected faults under the net state conditions set in order to detect the primary fault. And a new value is set to a test point that is still an indeterminate value to execute the generation of a test pattern for the above secondary fault indeterminate. And a process similar to the above is repeated until another secondary fault is not selected from the set of undetected faults. Here, when another secondary fault is selected, the same fault is not again detected. The dynamic compaction is to decrease test data by increasing the number of faults detected in units of test as mentioned above.

In case of a current processor having high grade its specifications, in view of requirements for processor speed and chip size, in some case, an RF (register file) being composed of a RAM (Random Access Memory) being a non scan-able memory device and an NSL (no scan latch) array is built in the processor.

And before and behind this type memory device, there are often disposed a combinational circuit having a high repeating symmetric property (for example, a write/read address selector), a combinational circuit including XORs (exclusive Ors) (for example, an EEC (error correct circuit) such as a parity check circuit), and a match compare circuit in a TAG RAM.

In the conventional dynamic compaction method or at an ATG (automatic test generator) for individual faults, in connection with the decision for solving an unsolved gate (D frontier) of fault propagation or solving an unsolved gate (J frontier) of output, in many cases, there is introduced a heuristic approach such as a rotating back-trace for avoiding a decision bias by a static reference that is decided topologically, or a controllable/observable reference (for example, LEVEL, SCOAP, and FANOUT BASE).

Here, the J frontier (Justify frontier) is an unsolved gate in which a selection is required for setting an input value because a request value exists in the output and two or more Xs (indeterminate values) exist in the input. The D frontier (different frontier) is an unsolved gate in which D (different) propagation is unknown because the difference D between a normal value and a fault value exists in at least one of the inputs and one or more Xs (indeterminate values) exist at the other inputs. And the decision signifies that the ATG selects a state given to the input for solving the above-mentioned J frontier/D frontier.

[Patent Literature 1] Japanese Patent Laid-Open Publication HEI1-52030

FIG. 15 is a diagram showing a part of a circuit having a structure of a CAM (Content Address-able Memory)/TLB (Translation Look-aside Buffer) circuit. This circuit shown in FIG. 15 is provided with a key section 101 having scan_1, scan_2, and scan_3, a memory section 102 being an RF (as a broad sense, RAM) composed of an NSL array, and a match compare section 103 being a combinational circuit including XORs. The memory section 102 is provided with an entry #1 and an entry #2.

At the CAM/TLB circuit shown in FIG. 15, the memory section 102 and the match compare section 103 are studied separately. At the conventional dynamic compaction method, there is a possibility that sufficient pattern compaction cannot be expected, by control involved in the match compare section 103 being a combinational circuit including the XORs, or by control with respect to "write" of the memory section 102, which has high "write" exclusiveness in the entry direction.

Next, inefficiency to the pattern compaction is explained for each of the following two cases. (1) is a case of the control involved in the combinational circuit including the XORs, and (2) is a case of the control involved in the RAM (RF) having the high write exclusiveness in the entry direction.

For the case (1) being with the control involved in the combinational circuit including the XORs, for example, at the circuit shown in FIG. 15, it is assumed that "stack at 0 fault" being composed of faults f11, f12 and f13 is the fault to be detected.

As confirmed by observing, an ideal test for the faults f11 to f13 is realized by executing fault excitation and propagation on one time plane by allocating the following states.

nsl_11=nsl_12=nsl_13=1
scan_1=scan_2=scan_3=0

Here, as a preparation pattern for controlling the NSLs, one or more time planes are actually required. However, in order to make it simple, at the time planes of the preparation pattern, when it is assumed that the control for the NSLs relating to at least one entry is arbitrary, the test for the faults f11 to f13 becomes a minimum test (ideal test) by two time planes (refer to FIG. 16).

FIG. 16 is a diagram showing an example of an ideal test at the detection of the faults f11 to f13 at the entry #1 shown in FIG. 15. And FIG. 17 is a diagram showing an example of its worst test.

Here, a process, in which the dynamic compaction is executed at the time when the fault f11 is a primary fault from the initial state of the circuit being that all of the NSLs are the indeterminate value X, is studied. In the test generation for the fault f11, about the fault excitation and the fault propagation, the nsl_11=1, nsl_12=1, and nsl_13=1 can be decided uniquely as an indispensable state by a unique path check.

That is, at the decision of the ATG, the state of the scan_1 for solving the eor_11 being the D frontier, and the states of the scan_2 and the scan_3 and the states of the nsl_12 and the nsl_13 for solving the eor_12 and the eor_13 being the J frontiers are decided respectively.

However, the XOR being the D frontier is solved when the states of the input pins except the input pin in which the fault is propagated are not the indeterminate value X. And the XOR being the J frontier is immediately decided by the implication process of the state of the remaining 1 pin, when the input state of the pin (input pin_1) is decided.

In FIG. 15, the eor_11 being the D frontier is solved by deciding the state of the scan_1 as a value except the indeterminate value X. And at the two input XORs at the eor_12 and the eor_13 being the J frontiers, the solution by deciding the state of the scan_2 and the solution by deciding the state of the nsl_12 are equivalent. Such is also the same with the decision of the scan_3 and the nsl_13 regarding the solution of the eor_13. Therefore, the solution of the D frontier (eor_11) and the solution of the J frontiers (eor_12 and eor_13) result in the state decision of the scan_11 to scan_13.

At this time, the topological controllability of the scan_1 to scan_3 as viewed from the eor_11 to the ero_13 is the same because of the repeat of the circuit. Furthermore, the controllability for setting 0 and 1 is symmetric and the same because the scan_1 to the scan_3 are their own control points. Therefore, at the test generation for the fault f11, the controllable/observable reference using at the ATG of the conventional dynamic compaction method dose not show any selection reference involved in the control for the XOR gates in the match compare section.

Consequently, in connection with the fault f11, the selection reference regarding the nsl_12 and the nsl_13 except the nsl_11 for the fault excitation is not shown, therefore, there is a possibility that the test was successful by chance by allocating the nsl_12=nsl_13=0. Here, the possibility allocating the nsl_12=nsl_13=0 is the same at the rotating back trace being random number operation.

Further, in FIG. 15, a case of a situation, in which the faults f12 and f13 become the secondary fault after generating the test pattern of the fault f11 to which the state of the nsl_12=nsl_13=0 was allocated, is studied. In this case, on the time plane, in which the fault f11 was excited, the net state in which the faults f12 and f13 are already assumed, becomes equal to the fault value (0), therefore, the excitation becomes impossible.

Therefore, when the fault f12 was made to be a target as the secondary fault, the dynamic compaction generates a test pattern by executing the fault excitation of the fault f12 in expanding a different time plane from the time plane that executed the fault excitation of the fault f11.

And as is the case with the generation of the test pattern for the fault f11, at the conventional dynamic compaction method, there is a possibility that the nsl_13=0 is allocated at the test for the fault f12. Therefore, three different time planes are used at the fault excitation for the faults f11 to f13. That is, at the above-mentioned ideal test, it is possible that the fault excitation/propagation of the faults f11 to f13 is realized by one time plane. However, at the conventional dynamic compaction method, as shown in FIG. 17, the number of the time planes is increased to three in the worst case. And this increase of the number of the time planes signifies the increase of the number of test patterns, and the compaction efficiency is decreased.

Therefore, at the conventional dynamic compaction method, by the repeat and the symmetric property of the circuit at the controllable/observable reference using in the ATG, there is a fear that the reference involved in the state selection at the circuit including the XORs (refer to the match compare section 103 in FIG. 15) cannot be given.

Next, the case (2) of the control involved in the RAM (RF) having the high write exclusiveness in the entry direction is explained. FIG. 18 is a diagram showing an example of an ideal test at the detection of the faults f11 to f13 at the entry #1 and the faults f21 to f23 at the entry #2 shown in FIG. 15. And FIG. 19 is a diagram showing an example of its worst test.

The control related to the above-mentioned combinational circuit including the XORs is adapted for dealing with possibilities of increase in the number of possible patterns for the faults (refer to the faults f11 to f13 in FIG. 15) in the same entry. As shown in the worst case (the worst test; refer to FIG. 17), in case that a different time plane is used for each fault excitation, that is, three time planes are used for the fault excitation of the faults f11 to f13 in FIG. 15, there is a possibility that the increase of the patterns affects the other entry due to the exclusiveness with respect to "write" in the entry direction.

The reason is that not only at the RAM (RF) in the CAM/TLB circuit but also at a RAM (RF) in generally use, the number of entries which can write in one cycle is generally smaller than the number of holding entries. That is, as an extreme case, an RF of a CAM/TLB circuit, in which the number of entries that can write in one clock is one, is studied. In this case, at the time planes, which are executing the writing to the NSLs of the entry #1 (time (t) in FIG. 16, and time (t) to (t+2) in FIG. 17), it is impossible to write in the NSLs except the NSLs of the entry #1.

That is, in case that the exclusiveness with respect to "write" between the entries is high, at the time when the "write" is executed to the NSLs at one entry, it is impossible that the "write" is executed to the NSLs at the other entry. Therefore, executing "write" to the NSLs by using many time planes for the faults at a focused entry prevents the "write" to the NSLs of a non-focused entry. Consequently, as a whole, the number of test patterns is increased and the efficiency at the pattern compaction is decreased (refer to FIGS. 18 and 19).

Therefore, for example, when an NSL becomes a J frontier at time (t), in order to satisfy this request value, at the past time (t−n, n>1), it is necessary that the state of NSL is set to the request value by executing the following operation.

Write operation: Clock=ON and Din=request value.
Set operation: Set=ON (Here, Set value is request value).
Reset operation: Reset=ON (Here, Reset value is request value).

However, as mentioned above, in case that the write exclusiveness in the entry direction is high, at the time when the "write" is being executed to the NSLs of one entry, there is a fear that the "write" to the NSLs of the other entry becomes impossible. That is, using many time planes for one entry without any consideration causes the increase in the test patterns as a whole.

SUMMARY OF THE INVENTION

It is therefore an object of the present invention to provide a test pattern generating method, a test pattern generating apparatus, and a storing medium stored with a test pattern generating program being readable by a computer. According to the present invention, effective dynamic compaction can be executed by suppressing the increase in the number of test patterns, for example, for no scan-able memory devices being built in a processor, a combinational circuit having a high repeating symmetric property, and a combinational circuit including XORs.

According to the present invention, for achieving the above-mentioned object, there is provided a test pattern generating method for an electronic circuit having XOR (exclusive OR) gates, in which a test pattern is generated for supplying the electronic circuit in order to detect faults of the electronic circuit corresponding to an output pattern of the electronic circuit. The test pattern generating method comprises a counting step for counting the number of faults becoming undetectable respectively, at each of states 0 and 1 that are able to be given to each of input pins of the XOR gates when each of the XOR gates becomes a D frontier (different frontier) or a J frontier (Justify frontier), a selecting step for selecting a state in which the number of faults becoming undetectable is smaller in the 0 and 1 states as an allocating state to the input pin, based on a counted result at the counting step, and a test pattern generating step for generating the test pattern based on a selected state at the selecting step.

And also, according to the present invention, there is provided a test pattern generating method for an electronic circuit having plural NSLs (no scan latches) that have exclusiveness with respect to "write", in which a test pattern is generated for supplying the electronic circuit in order to detect faults of the electronic circuit corresponding to an output pattern of the electronic circuit. The test pattern generating method comprises a holding step for holding states at plural kinds of time planes at the NSLs respectively, and a test pattern generating step for generating the test pattern in order that write operation is made to execute at the oldest time plane in the past time planes satisfying a request at time "t", by searching states at the plural kinds of time planes held at the holding step, when each of the NSLs becomes a J frontier at time "t".

And also, according to the present invention, there is provided a test pattern generating method for an electronic circuit having plural NSLs that have exclusiveness with respect to "write" and having XOR gates, in which a test pattern is generated for supplying the electronic circuit in order to detect faults of the electronic circuit corresponding to an output pattern of the electronic circuit. The test pattern generating method comprises a counting step for counting the number of faults becoming undetectable respectively, at each of states 0 and 1 that are able to be given to each of input pins of the XOR gates when each of the XOR gate becomes a D frontier or a J frontier, a selecting step for selecting a state in which the number of faults becoming undetectable is smaller in the 0 and 1 states as an allocating state to the input pin, based on a counted result at the counting step, a holding step for holding states at plural kinds of time planes at the NSLs respectively, and a test pattern generating step for generating the test pattern in order that write operation is made to execute at the oldest time plane in the past time planes satisfying a request at time "t", based on a selected state at the selecting step and by searching states at the plural kinds of time planes held at the holding step, when each of the NSLs becomes a J frontier at time "t".

Here, the test pattern generating step can comprise an implying step for implying an ON value from a clock terminal of a focused NSL being one NSL in the plural NSLs, and a recognizing step for recognizing that exclusiveness exists between the focused NSL implied the ON value and an NSL to which an OFF value reaches, in case that an NSL which an OFF value reaches to its clock terminal exists in NSLs except the focused NSL in the plural NSLs.

And also, according to the present invention, there is provided a storing medium stored with a test pattern generating program being readable by a computer for making the computer execute a function generating a test pattern for an electronic circuit having XOR gates, in which a test pattern is generated for supplying the electronic circuit in order to detect faults of the electronic circuit corresponding to an output pattern of the electronic circuit. And the test pattern generating program comprises a counting step for counting the number of faults becoming undetectable respectively, at each of states 0 and 1 that are able to be given to each of input pins of the XOR gates when each of the XOR gates becomes a D frontier or a J frontier, a selecting step for selecting a state in which the number of faults becoming undetectable is smaller in the 0 and 1 states as an allocating state to the input pin, based on a counted result at the counting step, and a test pattern generating step for generating the test pattern based on a selected state at the selecting step. And the test pattern generating program makes the computer execute the counting step, the selecting step, and the test pattern generating step.

And also, according to the present invention, there is provided a storing medium stored with a test pattern generating program being readable by a computer for making the computer execute a function generating a test pattern for an electronic circuit having plural NSLs that have exclusiveness with respect to "write", in which a test pattern is generated for supplying the electronic circuit in order to detect faults of the electronic circuit corresponding to an output pattern of the electronic circuit. And the test pattern generating program comprises a holding step for holding states at plural kinds of time planes at the NSLs respectively, and a test pattern generating step for generating the test pattern in order that write operation is made to execute at the oldest time plane in the past time planes satisfying a request at time "t", by searching states at the plural kinds of time planes held at the holding step, when each of the NSLs becomes a J frontier at time "t". And the test pattern generating program makes the computer execute the holding step, and the test pattern generating step.

And also, according to the present invention, there is provided a storing medium stored with a test pattern generating program being readable by a computer for making the computer execute a function generating a test pattern for an electronic circuit having plural NSLs that have exclusiveness with respect to "write" and having XOR gates, in which a test pattern is generated for supplying the electronic circuit in order to detect faults of the electronic circuit corresponding to an output pattern of the electronic circuit. And the test pattern generating program comprises a counting step for counting the number of faults becoming undetectable respectively, at each of states 0 and 1 that are able to be given to each of input pins of the XOR gates when each of the XOR gates becomes a D frontier or a J frontier, a selecting step for selecting a state in which the number of faults becoming undetectable is smaller in the 0 and 1 states as an allocating state to the input pin, based on a counted result at the counting step, a holding step for holding states at plural kinds of time planes at the NSLs respectively, and a test pattern generating step for generating the test pattern in order that write operation is made to execute at the oldest time plane in the past time planes satisfying a request at time "t", based on a selected state at the selecting step and by searching states at the plural kinds of time planes held at the holding step, when each of the NSLs becomes a J frontier at time "t". And the test pattern generating program makes the computer execute the counting step, the selecting step, the holding step, and the test pattern generating step.

Here, the test pattern generating program, when the computer is made to execute the test pattern generating step can comprise an implying step for implying an ON value from a clock terminal of a focused NSL being one NSL in the plural NSLs, and a recognizing step for recognizing that exclusiveness exists between the focused NSL implied the ON value and an NSL to which an OFF value reaches, in case that an NSL which an OFF value reaches to its clock terminal exists in NSLs except the focused NSL in the plural NSLs. And the test pattern generating program makes the computer execute the implying step, and the recognizing step.

According to the present invention, printing data in which patterns were compacted can be effectively obtained by decreasing the number of test patterns.

BRIEF DESCRIPTION OF THE DRAWINGS

FIG. 10 is a diagram showing an example of a minimum test for detecting faults f11 to f13 at an electronic circuit showing in FIG. 15;

FIG. 16 is a diagram showing an example of an ideal test at the detection of the faults f11 to f13 at the entry #1 shown in FIG. 15;

FIG. 17 is a diagram showing an example of the worst test at the detection of the faults f11 to f13 at the entry #1 shown in FIG. 15;

FIG. 18 is a diagram showing an example of an ideal test at the detection of the faults f11 to f13 at the entry #1 and faults f21 to f23 at an entry #2 shown in FIG. 15; and FIG. 19 is a diagram showing an example of the worst test at the detection of the faults f11 to f13 at the entry #1 and the faults f21 to f23 at the entry #2 shown in FIG. 15.

DETAILED DESCRIPTION OF THE PREFERRED EMBODIMENTS

Figure 1:
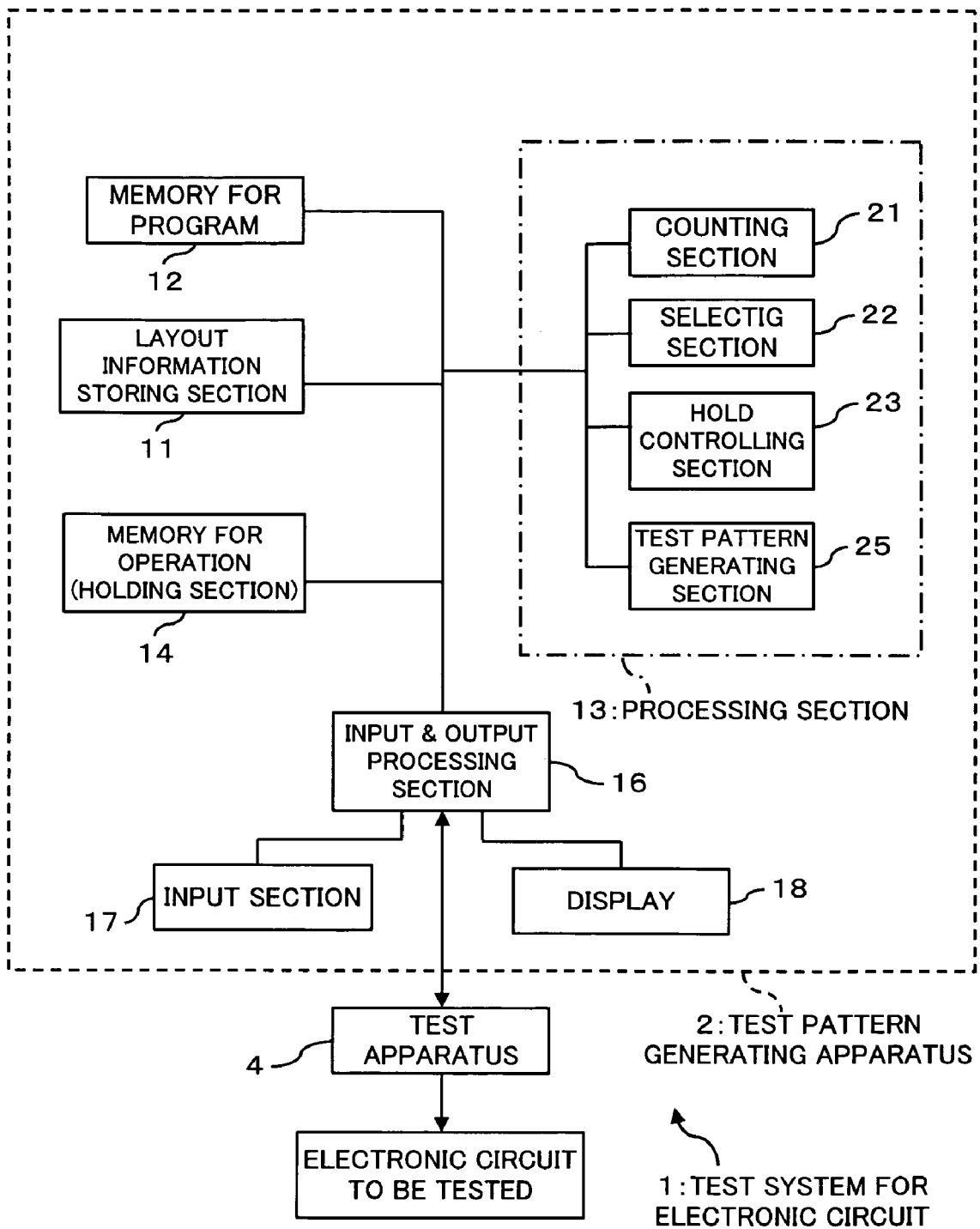
FIG. 1 is a block diagram showing a structure of a test system for electronic circuit for realizing a test pattern generating method as an embodiment of the present invention.

Referring now to the drawings, an embodiment of the present invention is explained.

FIG. 1 is a block diagram showing a structure of a test system for electronic circuit for realizing a test pattern generating method as one embodiment of the present invention.

A test system for electronic circuit 1 detects faults in an electronic circuit to be tested (hereinafter referred to as an electronic circuit) corresponding to an output pattern of the electronic circuit. As shown in FIG. 1, the test system for electronic circuit 1 comprises a test pattern generating apparatus 2 and a test apparatus 4.

The test pattern generating apparatus 2 generates a test pattern to be supplied to an electronic circuit by using a test pattern generating method as one embodiment of the present invention. And as shown in FIG. 1, the test pattern generating apparatus 2 comprises a layout information storing section 11, a memory for program 12, a processing section 13, a memory for operation (holding section) 14, an input and output processing section 16, an input section 17, and a display 18.

The layout information storing section 11 stores layout information of an electronic circuit to be tested, and the memory for program 12 stores a program for generating a test pattern. The memory for operation (holding section) 14 a stores interim results and the like at the process by the processing section 13 and holds states at plural kinds of time planes at NSLs respectively. The process in the processing section 13 is explained later. The input and output processing section 16 executes input and output processes of commands and data. From the input section 17, the commands and data are inputted by way of to the input and output processing section 16. The display 18 displays data and the like.

The processing section 13 generates test patterns corresponding to the layout information stored in the layout information storing section 11, and the process is executed by the program stored in the memory for program 12. Actually, for example, the test pattern generating apparatus 2 is composed of an information processing apparatus (computer system) having a CPU. And functions of the processing section 13 are realized such that the CPU executes the program (test pattern generating program) stored in the memory for program 12. The functions (a counting section 21, a selecting section 22, a hold controlling section 23, and a test pattern generating section 25) in the processing section 13 are explained later in detail.

Here, the program (test pattern generating program) for realizing the functions of the counting section 21, the selecting section 22, the hold controlling section 23, and the test pattern generating section 25 is stored in a storing medium being readable by a computer and supplied to the computer. As the storing medium, for example, there are a flexible disk, a CD-ROM, a CD-R, a CD-R/W, a DVD, a DVD-R, a DVD-R/W, a magnetic disk, an optical disk, and a magnetic optical disk. And the computer reads the program from the storing medium and stores the program in an internal storage or an external storage so as to use it. Further, it is possible that the program is stored in storage (storing medium) such as a magnetic disk, an optical disk, and a magnetic optical disk, and the computer obtains the program from the storage via a communication network.

At the time when the functions of the counting section 21, the selecting section 22, the hold controlling section 23, and the test pattern generating section 25 are realized, the program stored in the internal storage (a RAM and a ROM in the computer system at the embodiment) is executed by a microprocessor (the CPU in the computer at the embodiment). At this time, it is possible that the computer executes the program by reading the program stored in the storing medium.

At the embodiment of the present invention, the computer includes hardware and an operating system, and the hardware operates under the control of the operating system. And in case that the hardware is operated by only an application program, without using the operating system, the hardware itself corresponds to the computer. The hardware comprises at least a microprocessor such as a CPU and a means for reading a computer program stored in a storing medium. At the embodiment of the present invention, the test pattern generating apparatus 2 comprises a function as the computer.

Further, as the storing medium at the embodiment of the present invention, in addition to the above-mentioned storing medium, the flexible disk, the CD(CD-ROM, the CD-R, the CD-R/W), the DVD(the DVD-ROM, the DVD-RAM, the DVD-R, the DVD-RW, the DVD+RW), the magnetic disk, the optical disk, and the magnetic optical disk, the following various media can be used. That is, various media such as an IC card, a ROM cartridge, a magnetic tape, a punch card, an internal storage (memory such as a RAM and a ROM) of the computer, an external storage, printed matter, in which signs such as bar codes were printed, being readable by the computer, can be used as the storing medium.

As shown in FIG. 1, the processing section 13 comprises the counting section 21, the selecting section 22, the hold controlling section 23, and the test pattern generating section 25.

The counting section 21, at an electronic circuit to be tested having XOR gates, respectively counts the number of faults becoming undetectable, for each of states 0 and 1 that can be given to each input pin of the XOR gate, when the XOR gate becomes a D frontier or a J frontier.

The selecting section 22, based on the counted result by the counting section 21, selects a state in which the number of faults becoming undetectable is smaller in the states 0 and 1 as an allocating state to the input pin. The hold controlling section 23 controls the memory for operation 14 in order that the memory for operation 14 holds states of the plural kinds of time planes at NSLs respectively.

The test pattern generating section 25 generates a test pattern based on the state selected by the selecting section 22. Further, the test pattern generating section 25 generates a test pattern in order that write operation is made to execute at the oldest time plane in the past time planes that satisfy a request at time (t), when an NSL becomes a J frontier at time (t), by searching states at the plural kinds of time planes stored in the memory for operation 14.

Further, the test pattern generating section 25, with respect to a focused NSL being one NSL out of the plural NSLs, implies an ON value from the clock terminal of the focused NSL. And in case that an NSL which an OFF value reaches to its clock terminal exists at NSLs except the focused NSL in the plural NSLs, the test pattern generating section 25 recognizes that exclusiveness exists between the focused NSL implied the ON value and the NSL to which the OFF value reaches.

The test apparatus 4 tests an electronic circuit based on a test pattern generated at the test pattern generating apparatus 2.

Next, an effective dynamic compaction method is explained, for a no scan-able memory device built in a processor, a combinational circuit having a high repeating symmetric property, and a combinational circuit including XORs.

Here, the J frontier is an unsolved gate in which a selection is required for setting an input value because an expected value exists in the output and two or more Xs (indeterminate values) exist in the input. The D frontier is an unsolved gate in which D (different) propagation is unknown because the difference D between a normal value and a fault value exists in at least one of the inputs and one or more Xs (indeterminate values) exist at the other inputs. And the decision signifies that the ATG selects a state given to the input for solving the above-mentioned J frontier/D frontier.

First, (A) a selection of a solution state at the combinational circuit including XORs is explained. At the test pattern generating apparatus 2, when the XOR gates (the match compare section 103 at the example of the electronic circuit shown in FIG. 15) become D/J frontiers, a state, in which the number of faults becoming undetectable in the state 0 or 1 given to an input pin of each of the XORs is smaller, is selected as an allocating state to the input pin.

That is, at the processing section 13, the counting section 21 counts the number of faults becoming undetectable at each of the states 0 and 1 that can be given to each of the input pins of the XORs respectively. And the selecting section 22, based on these counted results, selects a state, in which the number of faults becoming undetectable is smaller, as an allocating state to the input pin.

Next, an actual example of a state selecting method at the test pattern generating method in the embodiment of the present invention is explained. Here, at this example, the counting section 21 counts the number of faults becoming undetectable at 0 implication by using a counter undetectable [0], and counts the number of faults becoming undetectable at 1 implication by using a counter undetectable [1] respectively.

Steps at the state selecting method are as follows:

Step 1:
Select one input pin whose state is X in XORs being D/J frontiers.
/* select 0*/
Step 2-1:
Initialize the number of faults becoming undetectable at 0 implication to undetectable [0]=∞.
Step 2-2:
Imply 0 to the input pin selected at the step 1.
Step 2-2:
Go to step 3-1, when conflict occurred at the step 2-2.
Step 2-3 (counting step):
Count undetectable [0] by function 1 (explain later).
Step 2-4:
Recover the implication at the step 2-2.
/* select 1 */
Step 3-1:
Initialize the number of faults becoming undetectable at 1 implication to undetectable [1]=∞.
Step 3-2:
Imply 1 to the input pin selected at the step 1.
Step 3-2:
Go to step 4, when conflict occurred at the step 3-2.
Step 3-3 (counting step):
Count undetectable [1] by function 1.
Step 3-4:
Recover the implication at the step 3-2.
/* decide solution sate */
Step 4 (selecting step):
If undetectable [0]>undetectable [1], then select state=1.
If undetectable [1]>undetectable [0], then select state=0.
If undetectable [0]=undetectable [1], then select state=0 or 1.

Next, the function 1 is explained.

Initialize counter=0.

Repeat the following processes involved in a net whose state was decided by the implication.

/* count the number in which fault excitation is impossible */

If (an implied normal value state is 0) and (an undetected 0 fault exists),

Or (an implied normal value state is 1) and (an undetected 1 fault exists),

Then increase counter by increment.

/* count the number in which fault propagation is impossible */

If (an implied normal value state is 0) and (a net is an input pin of an AND gate), Or (an implied normal value state is 1) and (a net is an input pin of an OR gate), Then add, the number of undetected faults existing in a trace cone by tracing back a FFR (fan-out free region) from an input pin except a focused input pin, to the counter.

Then, the counter value is returned as a recovery value.

Figure 2:
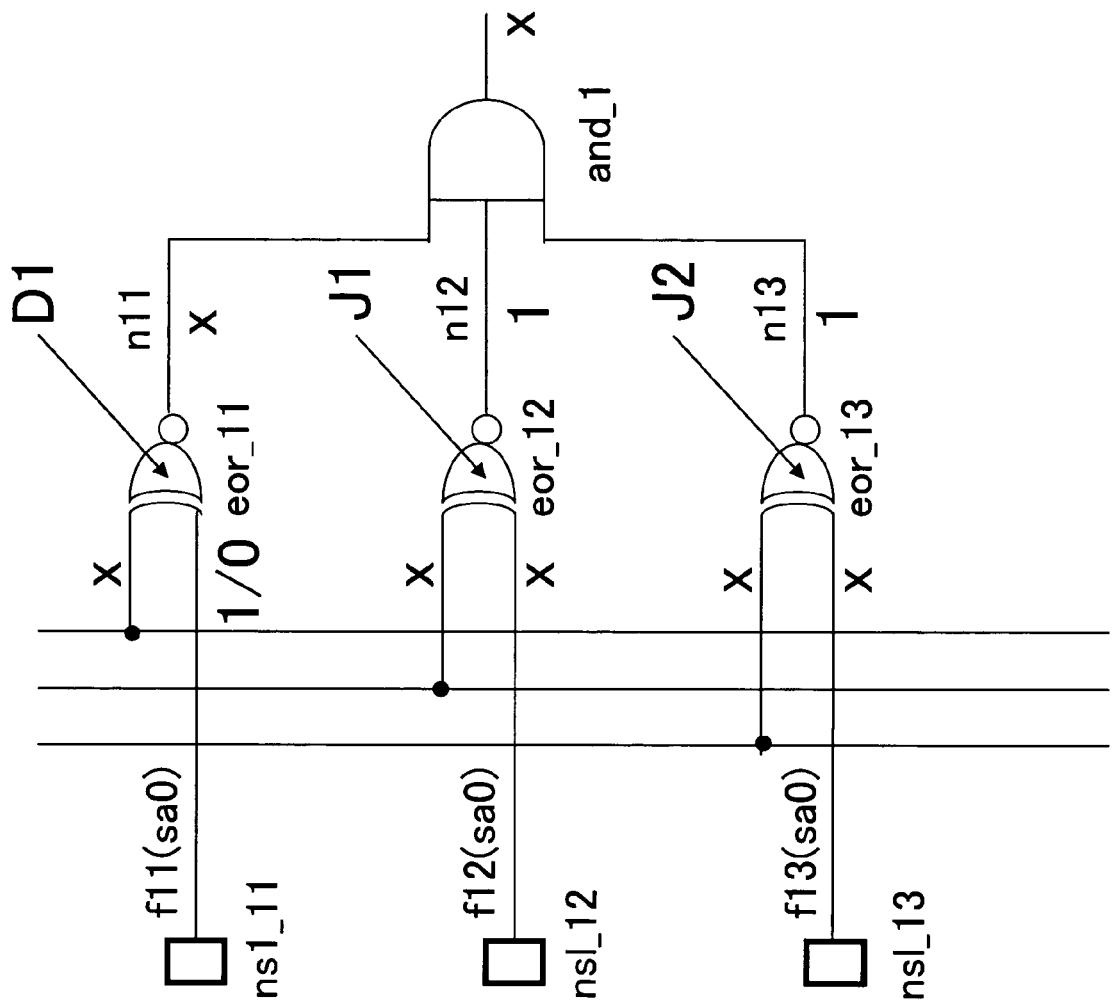
FIG. 2 is a diagram for explaining a state selecting method by the test pattern generating method as the embodiment of the present invention.
Figure 3:
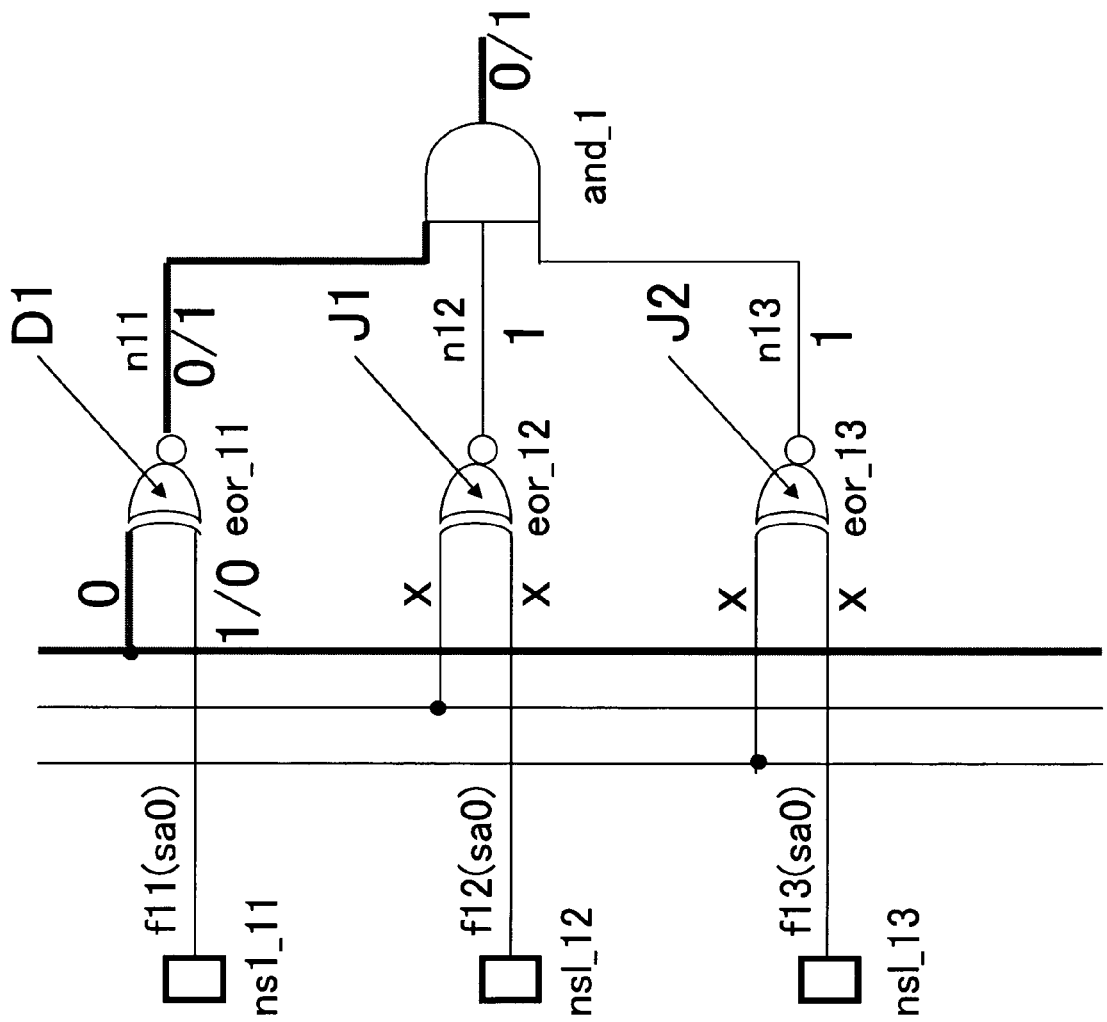
FIG. 3 is a diagram for explaining a state selecting method by the test pattern generating method as the embodiment of the present invention.
Figure 4:
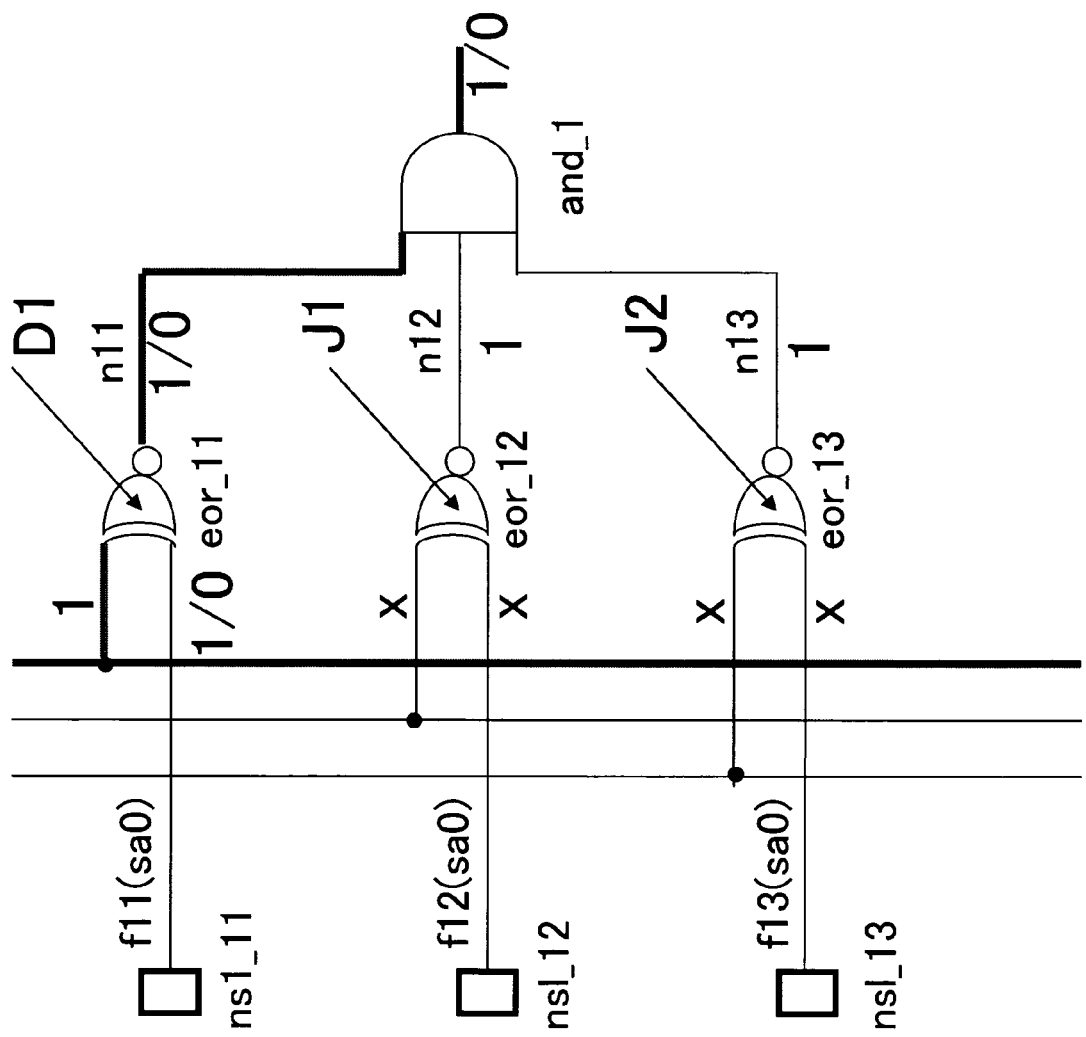
FIG. 4 is a diagram for explaining a state selecting method by the test pattern generating method as the embodiment of the present invention.
Figure 5:
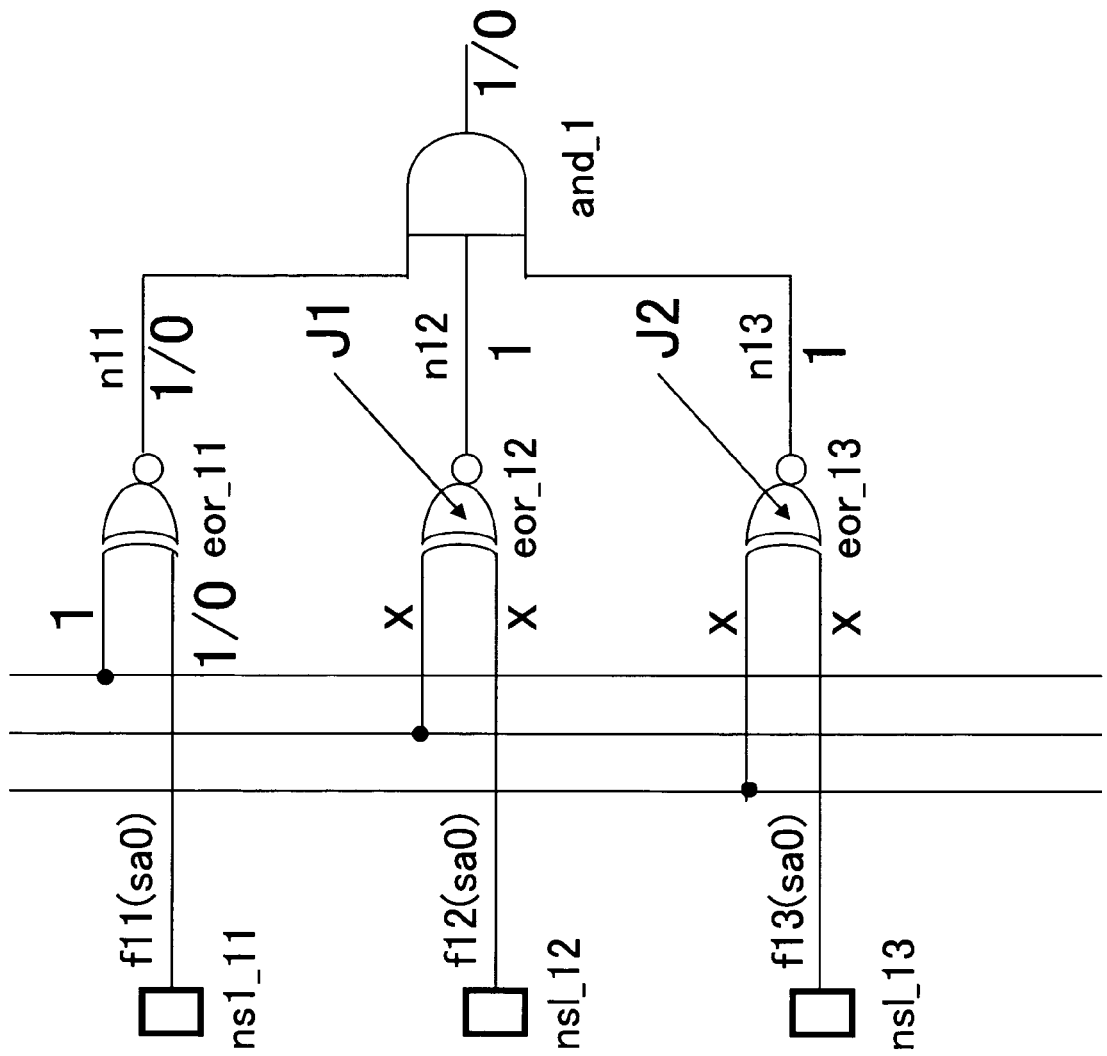
FIG. 5 is a diagram for explaining a state selecting method by the test pattern generating method as the embodiment of the present invention.
Figure 6:
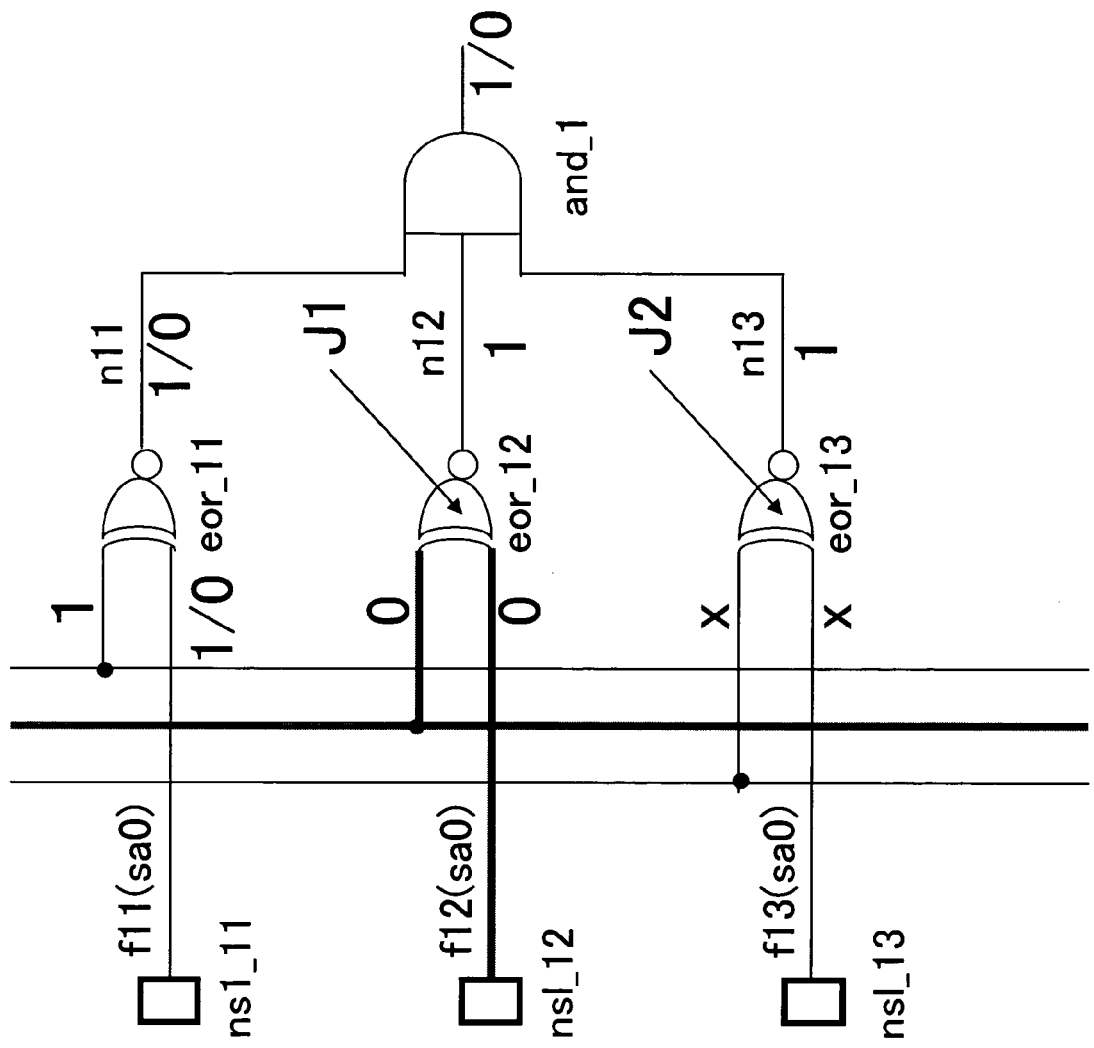
FIG. 6 is a diagram for explaining a state selecting method by the test pattern generating method as the embodiment of the present invention.
Figure 7:
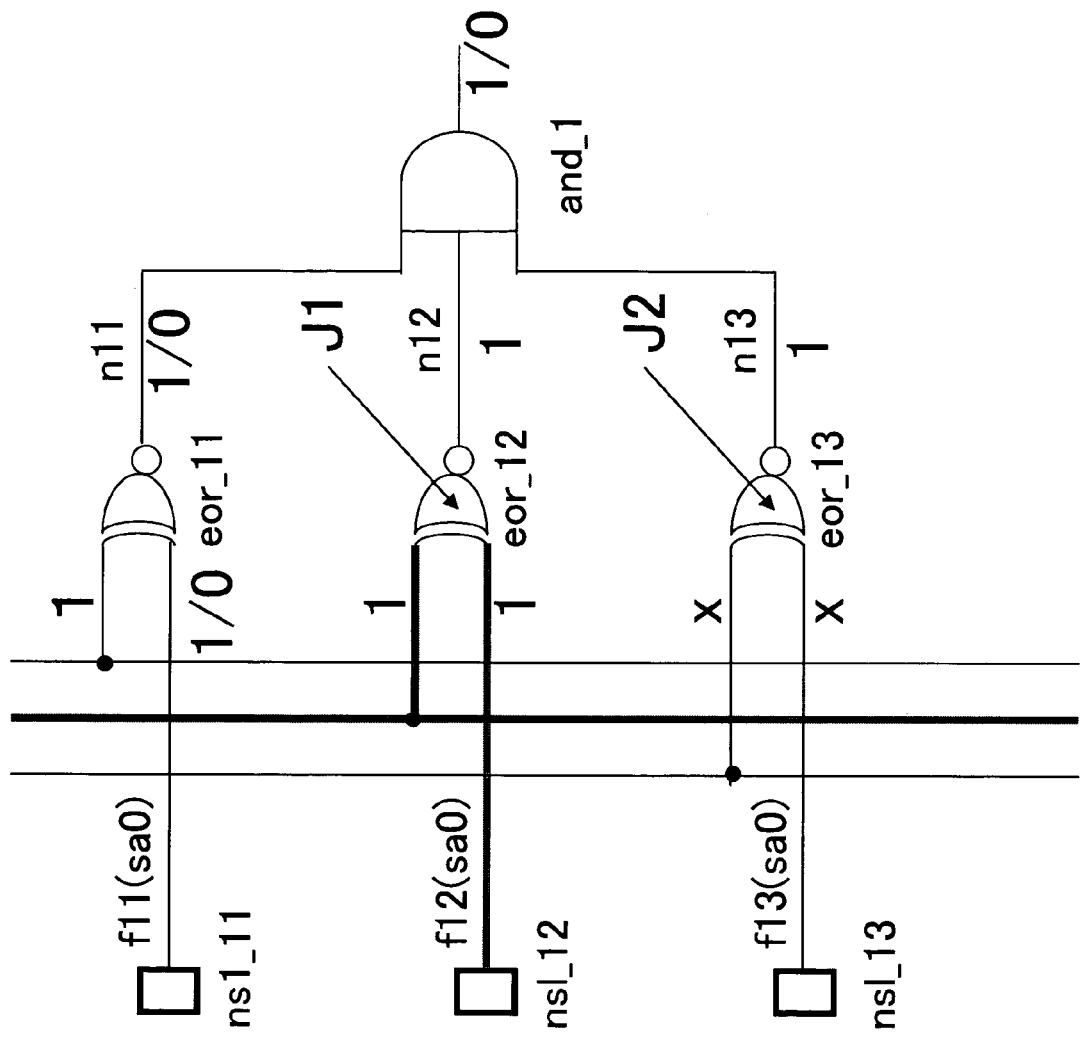
FIG. 7 is a diagram for explaining a state selecting method by the test pattern generating method as the embodiment of the present invention.
Figure 8:
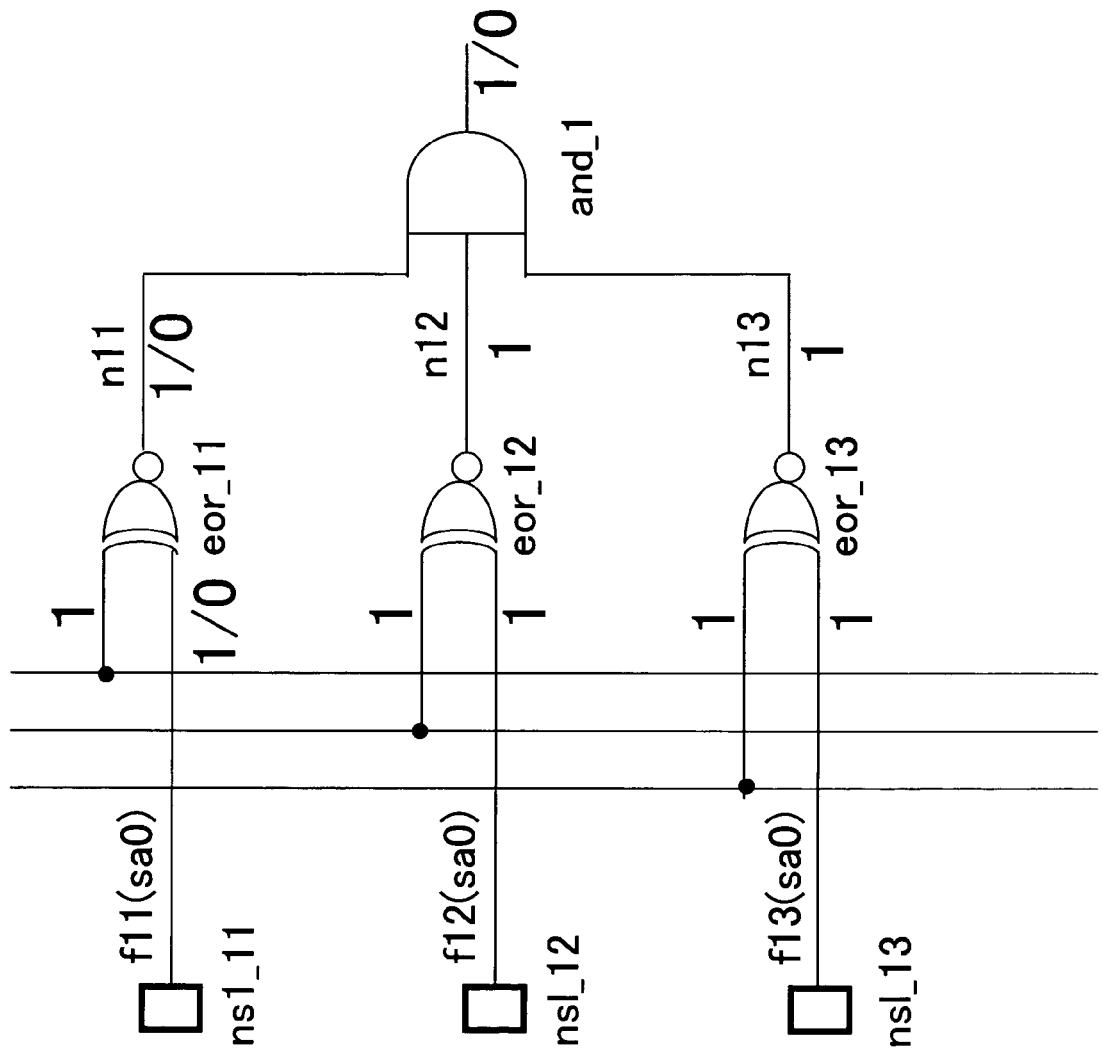
FIG. 8 is a diagram for explaining a state selecting method by the test pattern generating method as the embodiment of the present invention.

Next, referring to FIGS. 2 to 8 and FIG. 15, the state selecting method by the test pattern generating method at the embodiment of the present invention is explained. FIG. 2 is a diagram showing a state in which a decidable state was allocated as an indispensable state when a fault f11 is a primary fault. FIG. 3 is a diagram showing a state in which 0 was implied for solving a D frontier at the electronic circuit shown in FIG. 15. FIG. 4 is a diagram showing a state in which 1 was implied for solving a D frontier at the electronic circuit shown in FIG. 15. FIG. 5 is a diagram showing a state in which 1 was implied at the electronic circuit shown in FIG. 15. FIG. 6 is a diagram showing a state in which an nsl_12 at the electronic circuit shown in FIG. 15 was implied in 0. FIG. 7 is a diagram showing a state in which an nsl_12 at the electronic circuit shown in FIG. 15 was implied in 1. And FIG. 8 is a diagram showing a state in which frontiers D1, J1, and J2 at the electronic circuit shown in FIG. 15 were solved.

Here, in FIG. 2, an example, in which a D frontier (D1: eor_11) and J frontiers (J1: eor_12, and J2: eor_13) to be decided at an ATG exist, is shown.

Next, the state selecting method at the frontiers D1, J1, and J3 by the test pattern generating apparatus 2 is explained.

(1) The state selection at the D frontier (D1: eor_11)

Step 1:

At the D1, one input pin having an X state exists.

Step 2-1 to 2-2:

Next, 0 is implied to the input pin. Here, a net in which a state is decided by the implication is shown as a bold line in FIG. 3.

Step 2-3:

By the above-mentioned function 1, a normal value 0 is decided at one (nl1) of the input nets of an and_1 by the implication of the step 2-2. Therefore, a back trace is executed from the n12 to n13, and two faults f12 and f13 are counted as undetectable faults, and undetectable [0]=2 is set.

Step 3-1 to 3-2:

Next, 1 is implied to the input pin. Here, a net in which a state is decided by the implication is shown as a bold line in FIG. 4.

Step 3-3:

By the above-mentioned function 1, a fault to be counted as an undetectable fault does not exist by the implication of the step 3-2, and undetectable [1]=0 is set.

Step 4:

Since undetectable [0]>undetectable [1], 1 is selected as a state for solving the D1. Here, a state in which 1 was implied selected at the step 4 is shown in FIG. 5.

Next, as shown in FIG. 5, state selecting operation concerning the J1 and J2 at the state that the D1 was solved is explained.

(2) The state selection at the J frontiers (J1: eor_12 and J2: eor_13)

Step 1:

Since two input pins having an X state exist at the J1, either of the two input pins is selected. Here, it is assumed that an input pin being driven by the nsl_12 is selected.

Step 2-1 to 2-2:

Next, 0 is implied to the input pin. Here, a net in which a state is decided by the implication is shown as a bold line in FIG. 6.

Step 2-3:

By the above-mentioned function 1, since the output of the nsl_12 is implied to 0 by the implication at the step 2-2, the fault of the f12 is counted as an undetectable fault, and undetectable [0]=1 is set.

Step 3-1 to 3-2:

Next, 1 is implied to the input pin. Here, a net in which a state is decided by the implication is shown as a bold line in FIG. 7.

Step 3-3:

By the above-mentioned function 1, a fault to be counted as an undetectable fault does not exist by the implication of the step 3-2, and undetectable [1]=0 is set.

Step 4:

Since undetectable [0]>undetectable [1], 1 is selected as a state for solving the J1.

In the same way, for solving the J2, as the state of the nsl_13, 1 is selected.

By the above mentioned processes, as shown in FIG. 8, the state of each of the frontiers D1, J1 and J2 is decided by the test pattern generating apparatus 2 at the embodiment of the present invention. And the test pattern generating section 25 generates a test pattern based on the states decided (selected) by these processes (test pattern generating steps).

As mentioned above, by the test pattern generating apparatus 2, an ideal test pattern, in which all of the faults concerning the faults f11 to f13 are excited/propagated at the same time on one time plane, can be generated.

(B) The write control of a RAM having high exclusiveness in the entry direction

At the test pattern generating apparatus 2, when an NSL having exclusiveness with respect to "write" becomes a J frontier at time (t), by searching a time plane in the past time direction, that is, in the time direction (t−n, n>1), write operation is executed at the oldest time plane in the past time planes satisfying a request at time (t).

That is, the memory for operation 14 holds states of plural kinds of time planes at an NSL respectively (holding step). And the test pattern generating section 25, when the NSL becomes a J frontier at time (t), searches the states of the plural kinds of time planes holding in the memory for operation 14, and makes to execute write operation at the oldest time plane in the past time planes satisfying the request at time (t).

When the NSL becomes a J frontier at time (t), in order to satisfy its request value, at the past time (t−n, n>1), it is necessary that the state of the NSL is set to the request value, by executing the following operation.

Write operation:
Clock=ON and Din=request value
Set operation:
Set=ON (Here, Set value is request value)
Reset operation:
Reset=ON (Here, Reset value is request value)

In case that write exclusiveness in the entry direction is high, at the time when "write" is executed to NSLs in one entry, "write" to NSLs in the other entry may become impossible. And there is a possibility that using many time planes without any consideration may cause the increase of the test patterns as a whole.

Therefore, by executing the following write control, for the NSLs having high write exclusiveness in the entry direction, executing superfluous write operation is avoided, and write operation is allocated to the other entry, with this, the increase of the test patterns is suppressed.

Next, an actual example of a write controlling method at the test pattern generating apparatus 2 is explained.

Step 1:
/*
in connection with an NSL (J frontier) in which an RQ (request) state is requested at time (t), state search of time planes at the past time (t−n, n>1)*/
in connection with a state of a time plane at the closest time being possible from time t'=t−1:
  If a state satisfying the following condition exists,
  ((Clock=ON) and (Din=RQ or X))
  or
  ((Clock=ON or X) and (Din=RQ))
  then
  record a search successful flag and time (t').
  If the following state exists
  (Clock=ON) and (Din=inv[RQ])
  then
  record a search unsuccessful flag and end the search.

Step 2:
If a search successful flag has been recorded,
then
at time (t'),
set Clock=ON, Din=RQ at NSL and
at time (t−n+1 to t−1),
set Clock=OFF at NSL and
solve J frontier at time (t).

Step 3:
If a search unsuccessful flag has been recorded,
then
at time (t−1),
set Clock=ON, Din=RQ at NSL and
solve J frontier at time (t).

Figure 9A:
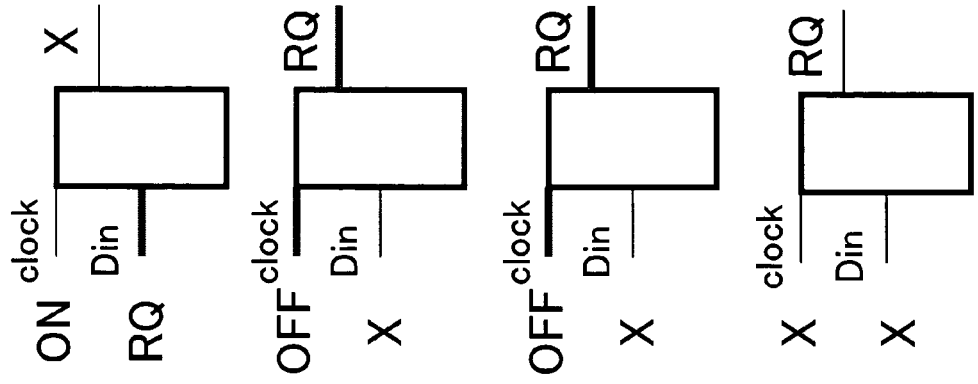
FIGS. 9 (*a*) and (*b*) are diagrams for explaining a write control method for NSLs at the test pattern generating method as the embodiment of the present invention.
Figure 9B:
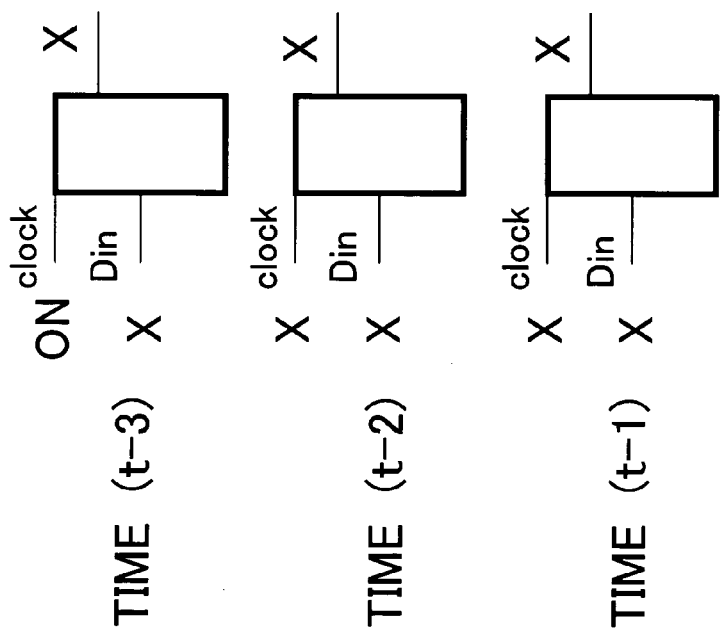

Next, referring to FIGS. 9 (a) and (b), a write control method of an NSL at the test pattern generating method in the embodiment of the present invention is explained. Here, FIG. 9 (a) is a diagram showing states of an NSL at plural time planes, and FIG. 9 (b) is a diagram showing states set for solving a J frontier shown in FIG. 9 (a). And the following case is shown in FIG. 9 (a). That is, when a request RQ exists to an NSL at time (t), since the state of the NSL is not set by the states of until time (t−1), a J frontier occurs.

Step 1:
Execute a time plane search in the past time from time (t−1) in FIG. 9 (a).
At the past time (t−3),
A write-able state satisfying
(Clock=ON and Din=X) exists, a search successful flag is recorded.

Step 2:
Since the search successful flag has been set at the step 1,
(t−3) Clock=ON, Din=RQ
(t−2) Clock=OFF
(t−1) Clock=OFF
are set, and a J frontier at time (t) is solved. Here, in FIG. 9 (b), states set by the step 2 are shown in a bold line.

Step 3:
Since the search unsuccessful flag has not been set at the step 1, the step 3 is not executed.

Figure 15:
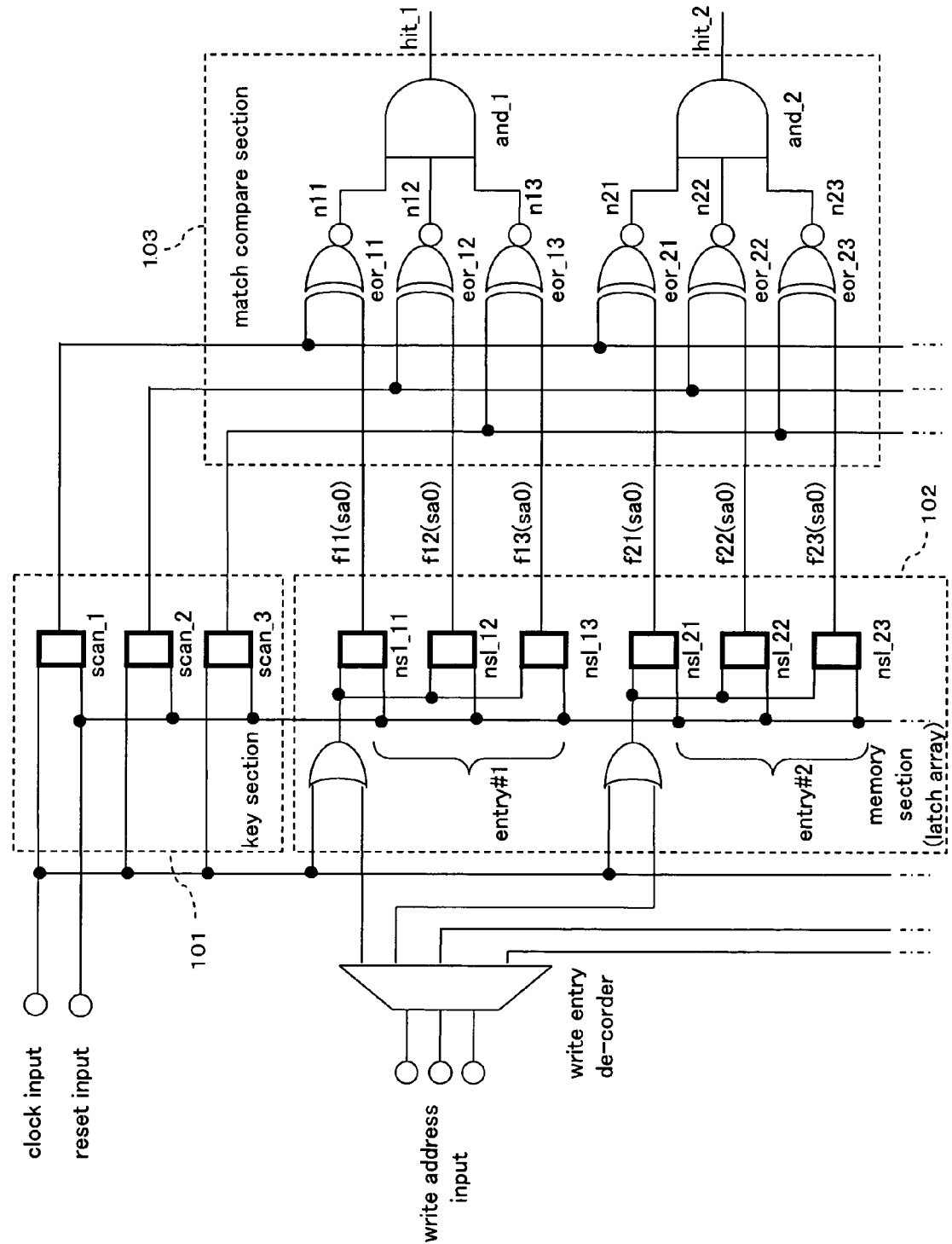
FIG. 15 is a diagram showing a part of a circuit having a structure of a CAM (content address-able memory)/TLB (translation look-aside buffer) circuit.

FIG. 10 is a diagram showing an example of a minimum test for detecting faults f11 to f13 at the electronic circuit shown in FIG. 15.

At FIG. 10, it is studied to detect faults f11 to f13 at the entry #1 and further to detect a fault f14 being a secondary fault (not shown) in the match compare section 103.

As mentioned above, the state shown in FIG. 10 is the minimum test detecting the faults f11 to f13 at the entry #1 at the same time. At this test, since the state of nl1 is equal to the fault value of the fault f14 and fault excitation is not executed, the f14 cannot be detected. Therefore, it is necessary that other time being not time (t+1) is used for the fault excitation of the f14.

Therefore, at time after the time (t+1) in which the excitation/propagation of the f11 to f13 is executed, that is, at and after the time (t+2), it is considered that the excitation/propagation of the f14 is executed.

Figure 11:
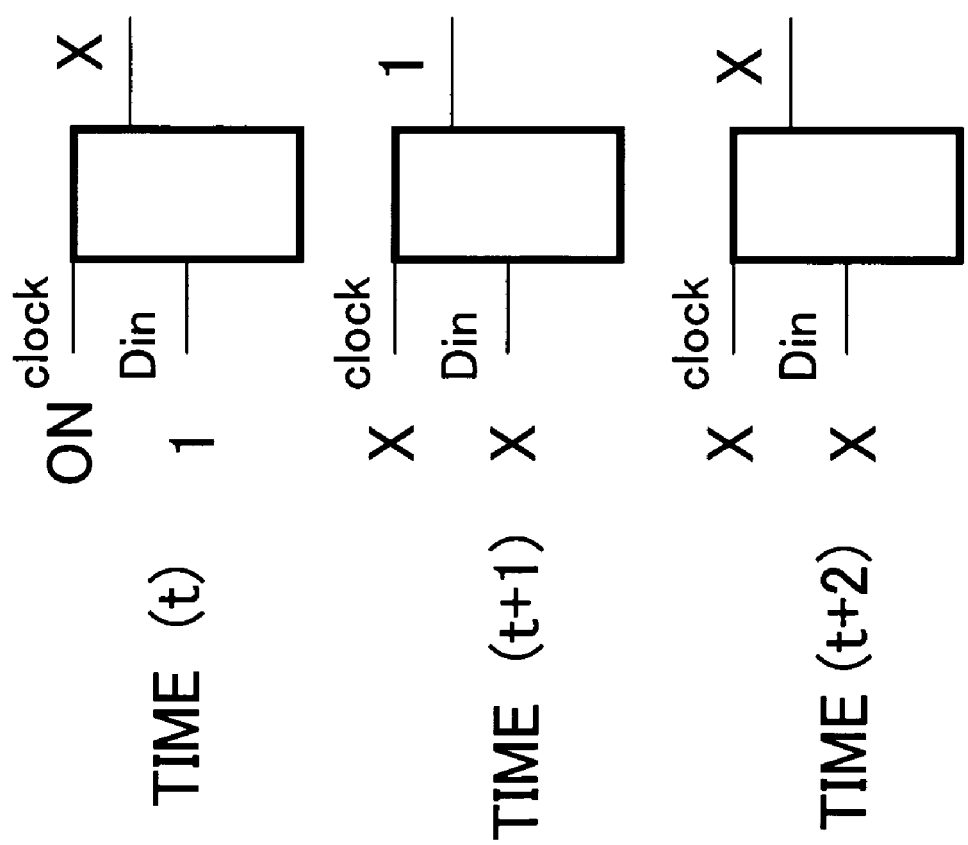
FIG. 11 is a diagram showing states of nsl_11 to nsl_13 of an entry #1 of the electronic circuit showing in FIG. 15 at each time (t to t+2) in detail.
Figure 12:
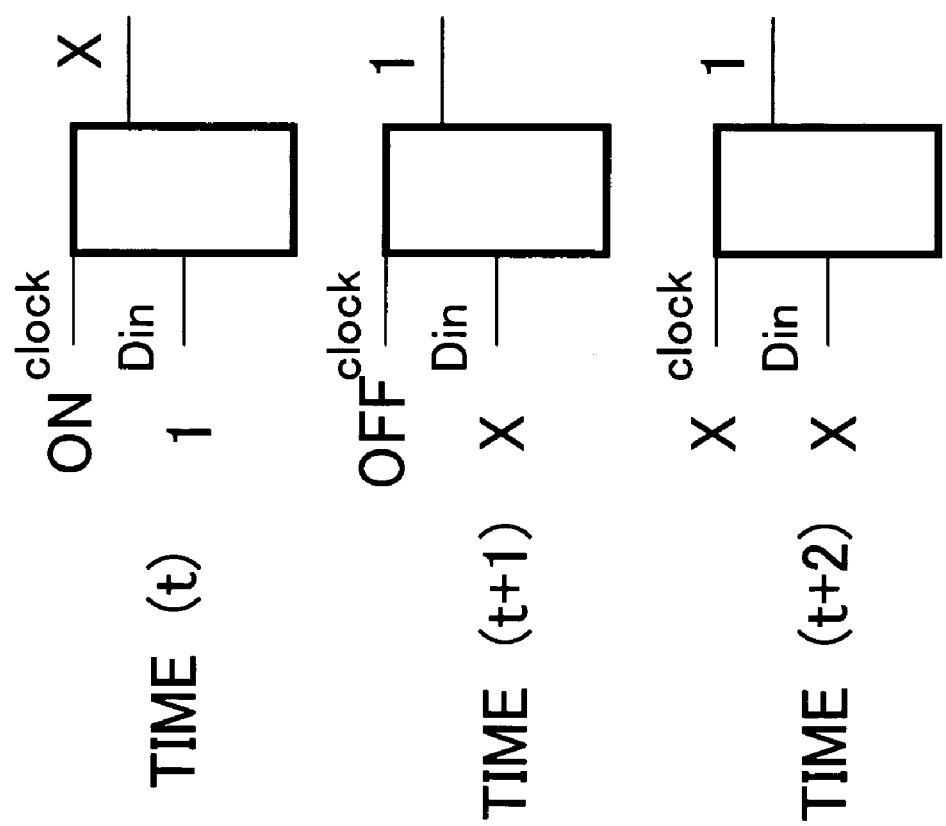
FIG. 12 is a diagram showing states of the nsl_11 to nsl_13 at a test detecting a fault f14.

FIG. 11 is a diagram showing states of the nsl_11 to nsl_13 of the entry #1 of the electronic circuit shown in FIG. 15 at each time (t to t+2) in detail. FIG. 12 is a diagram showing states of the nsl_11 to nsl_13 at a test detecting the fault f14.

At the excitation/propagation of the fault f14, states n11=0, n12=n13=1 are requested, since the Clock is X at the time (t+1) via eor_11 to eor_13 at the time (t+2), the nsl_11 to nsl_13 become J frontiers.

At this time, if a selection requesting 1 for the nsl_11 to nsl_13 being the J frontiers is intended to execute, state allocation, in which Clock=ON and Din=1 at the time (t+1) for solving the J frontiers, can be considered. However, by the write control for the J frontiers (NSLs), as shown in FIG. 12, a state, which makes the nsl_11 to nsl_13 at the entry #1 at the time (t+1) a hold state, is allocated.

If the state allocation being Clock=ON and Din=1 is executed at the time (t+1), the write operation being almost equal to at the time (t) is repeated, and at the time (t+1), the write operation at the NSLs except the NSLs at the entry #1 becomes impossible. Therefore, the number of test patterns is increased by that the operation becomes similar to the worst test shown in FIG. 19.

On the other hand, by the write control method at the test pattern generating method in the embodiment of the present invention, control, in which the NSLs at the entry #1 are made to be the hold state at the time (t+1), is executed. Therefore, the write operation at the other entries (at and after the entry #2) becomes possible, and the number of test patterns is decreased by that the operation becomes similar to the minimum test shown in FIG. 19.

(C) The recognition of exclusiveness of a RAM in the entry direction

At the test pattern generating apparatus 2, the test pattern generating section 25 focuses on an arbitrary one NSL and implies an ON value from the clock terminal of this focused NSL. If at NSLs except the focused NSL, an NSL to which an OFF value reaches to its clock terminal exists, the test pattern generating section 25 recognizes that exclusiveness exists between the focused NSL implied the ON value and the NSL to which the OFF value reaches.

At the dynamic compaction method for a RAM (RF) having high exclusiveness with respect to "write" between entries, the exclusiveness having the most severe affect for the test pattern generation is a case in which control of 1 entry write/1 clock is executed.

Next, in particular, an actual method for recognizing the exclusiveness between the entries in the case of the 1 entry write/i clock control is explained.

Step 1:

Select an arbitrary NSL (hereinafter this selected NSL is referred to as a focused NSL).

Step 2:

Imply an ON value to the clock terminal of the focused NSL.

Step 3:

If an OFF value is implied to clock terminals of NSLs except the focused NSL selected at the step 1 (hereinafter these NSLs are referred to as other NSLs), the focused NSL and the other NSLs are respectively marked as NSLs having exclusiveness (attach an exclusiveness mark).

Step 4:

The step 1 to step 3 are repeated until the above-mentioned processes are completed for all of the NSLs in the electronic circuit, or the exclusiveness mark is attached to all of the NSLs.

Figure 13:
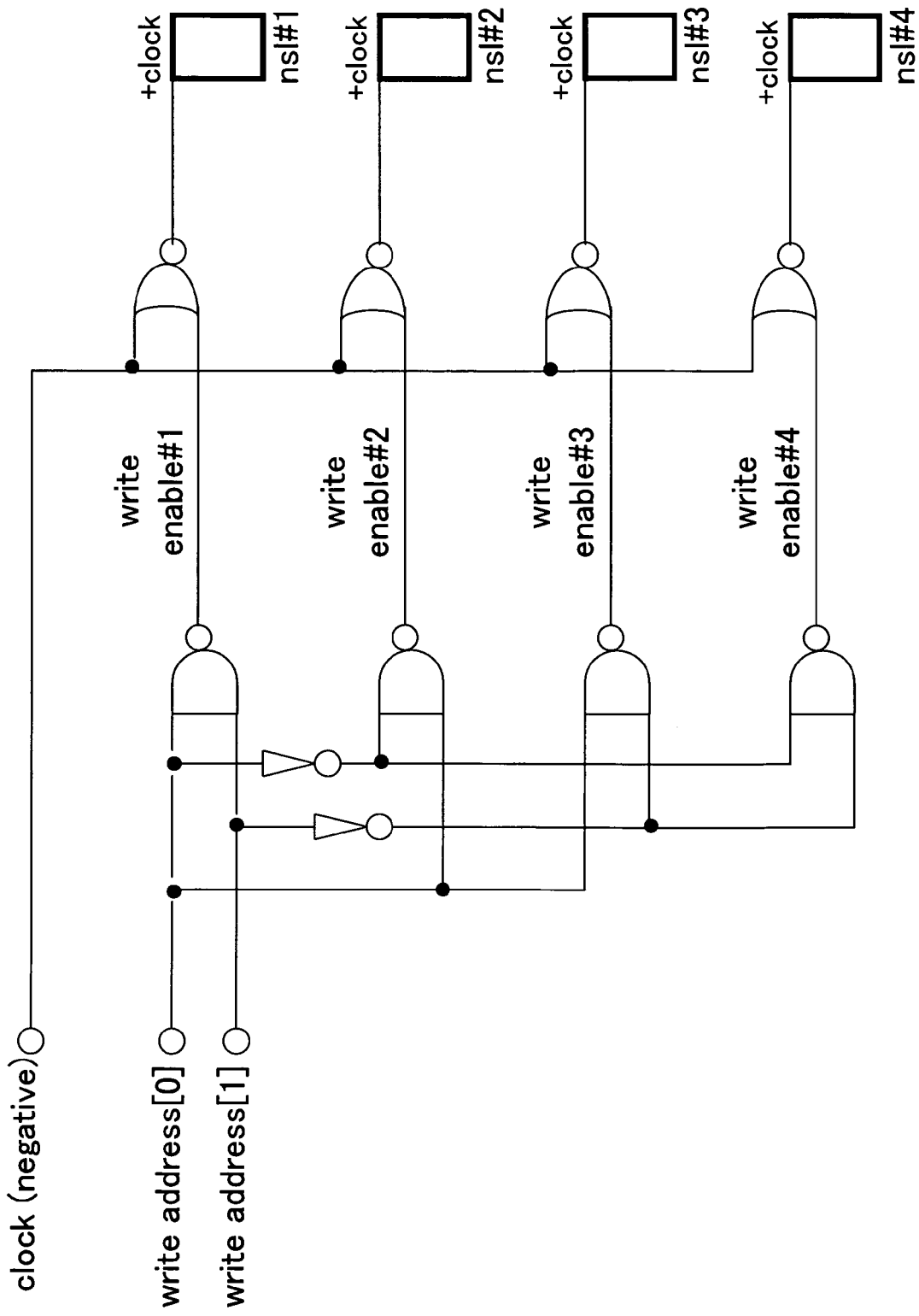
FIG. 13 is a diagram for explaining a recognizing method of exclusiveness between NSLs at the test pattern generating method in the embodiment of the present invention.
Figure 14:
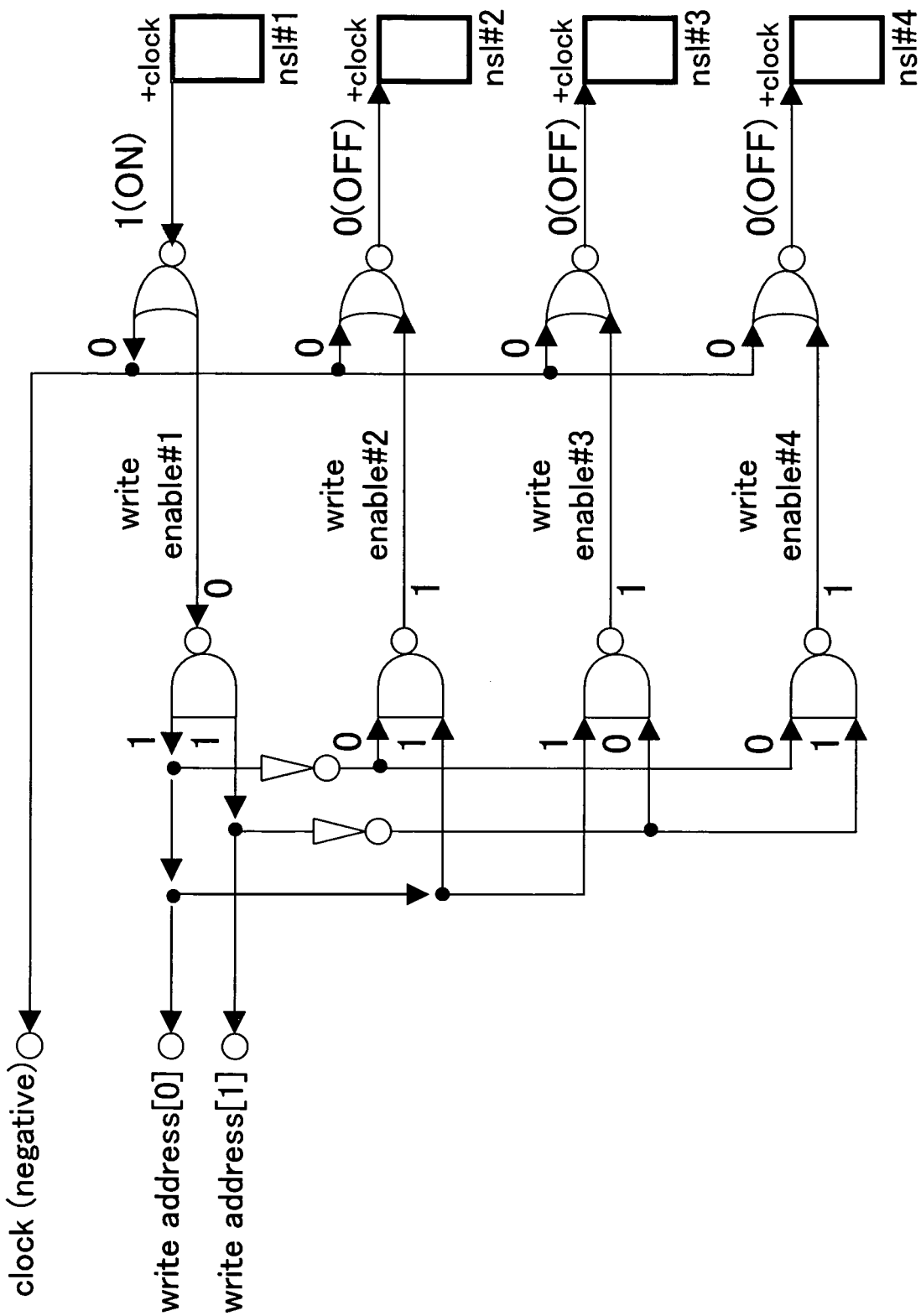
FIG. 14 is a diagram for explaining a recognizing method of exclusiveness between NSLs at the test pattern generating method in the embodiment of the present invention.

Next, referring to FIGS. 13, 14, and 15, a method for recognizing exclusiveness between NSLs at the test pattern generating method in the embodiment of the present invention is explained. Here, FIG. 13 is a diagram showing an example of a write entry decoder, and a write entry decoder being 1 entry write/1 clock having four entries, that is, a write entry decoder being hard de-coded, is shown. And FIG. 14 is a diagram showing an example of a state being implied from clock terminal=ON of an nsl#1 of the write entry decoder shown in FIG. 13.

Step 1:

Select an NSL of #1 (nsl#1) as a focused NSL.

Step 2:

Imply an ON value to the clock terminal of the nsl#1 (refer to FIG. 14).

Step 3:

Mark nsl#2, nsl#3, and nsl#4 to which Clock=OFF is implied and the focused nsl#1 as exclusiveness NSLs.

Step 4:

End processes because the exclusiveness mark was attached to all the nsl#1 to nsl#4.

As mentioned above, according to the method for recognizing exclusiveness, the hard de-coded write entry decoder being 1 entry write/1 clock does not have redundancy in its circuit. Therefore, by the implication in which the clock of the NSL at the one entry is made to ON, an OFF is implied to the clocks of NSLs at the other entry. Consequently, the exclusiveness between entries can be easily recognized by the method for recognizing exclusiveness at the embodiment of the present invention.

The present invention is not to be restricted by the above-mentioned embodiment, and the embodiment can be changed or modified without departing from the scope and spirit of the present invention.

For example, at the above-mentioned embodiment, as an example of a circuit including no scan-able memory devices, a combinational circuit having a high repeating symmetric property, and a combinational circuit including XORs, a TLB (Translation Look-Aside Buffer) structure built in address mapping by a CAM (Content Address-able Memory) was used for the explanation. However, the present invention is not limited to the CAM/TLB structure, for example, the present invention can be applied to any form of a combinational circuit including XORs and any form of a circuit of RAM (RF) having high write exclusiveness.

And also, at the above-mentioned embodiment of the present invention, as an example of a combinational circuit including XORs, the match compare section 103 (refer to FIG. 15) in the CAM/TLB structure was used for the explanation, but the present invention is not limited to this section. That is, at the selection of the solution state at the ATG, each of the XOR gates was focused on, and the selection is decided based on the number of undetectable faults when 0 and 1 are made to be respective solution states. This operation can be applied to all XORs in the combinational circuit. Therefore, the test pattern generating method of the present invention can be applied to any form of the combinational circuit including XORs such as a parity check circuit in an ECC, and a circuit executing carry operation in an addition/multiplication operator.

And also, at the above-mentioned embodiment of the present invention, as an example of an RF having high write exclusiveness in the entry direction, the memory section 102 (NSL array; refer to FIG. 15) in the CAM/TLB structure was used for the explanation, but the present invention is not limited to this section. That is, the redundancy of the write operation is avoided by focusing on each of NSLs in the RF (NSL array) or focusing on cells in the RAM at the write control in the ATG. Therefore, the present invention can be applied to all NSLs and or cells in the RF and RAM. Consequently, the test pattern generating method of the present invention can be applied to any of generally using RF and RAM in which an entry is decided selectively by a write address and writing is executed by a write clock or a write enable signal.

And also, at the above-mentioned embodiment of the present invention, as an example of an RF having a write entry decoder, the memory section 102 (refer to FIG. 15) in the CAM/TLB structure was used for the explanation, but the present invention is not limited to this section. That is, when a selection entry is decided at a write address decoder, an entry, in which non-selection is decided inevitably, is focused on, and write exclusiveness is recognized, therefore, the present invention can be applied to all Rfs and RAMs having write entry (or address) decoder. Consequently, the test pattern generating method of the present invention can be applied any of generally using RAM and RF in which writing entry is selectively decided by a write address.

What is claimed is:

1. A test pattern generating method for an electronic circuit having XOR (exclusive OR) gates, in which a test pattern is generated for supplying said electronic circuit in order to detect faults of said electronic circuit corresponding to an output pattern of said electronic circuit, comprising:

counting the number of undetectable faults occurring, at each input pin being in each of candidate states 0 and 1 of said XOR gates when each of said XOR gates becomes a D frontier (different frontier) or a J frontier (justify frontier);

selecting a state in which the number of undetectable faults is smaller from said candidate states 0 and 1 as an allocating state to a respective input pin, based on a counted result at said counting by selecting the candidate state 1 as the allocating state to be allocated to each said input pin when the number of unpredictable faults at each said input pin and the candidate state 0 is larger than that in the candidate state 1 and selecting the candidate state 0 as the allocating state to be allocated to each said input pin when the number of unpredictable faults at each said input pin in the candidate state 1 is larger than that of the candidate state 0; and generating said test pattern based on a selected state at said selecting.

2. A test pattern generating method for an electronic circuit having plural NSLs (no scan latches) that have exclusiveness with respect to "write", in which a test pattern is generated for supplying said electronic circuit in order to detect faults of said electronic circuit corresponding to an output pattern of said electronic circuit, comprising:

holding states at plural kinds of time planes at said NSLs respectively;

selecting an oldest time plane by retrieving in the past time planes satisfying a request at time "t" by retrieval from states at said plural kinds of time planes held at said holding, when each of said NSLs becomes a J frontier at time "t"; and generating said test pattern in order that write operation is made to execute at the oldest time plane selected in the step of selecting.

3. The test pattern generating method according to claim 2, wherein:

said generating comprising:

implying an ON value from a clock terminal of a focused NSL being one NSL in said plural NSLs; and recognizing that exclusiveness exists between said focused NSL which implies said ON value and an NSL which an OFF value reaches, in case that an NSL which an OFF value reaches to its clock terminal exists in NSLs except said focused NSL in said plural NSLs.

4. A test pattern generating method for an electronic circuit having plural NSLs that have exclusiveness with respect to "write" and having XOR gates, in which a test pattern is generated for supplying said electronic circuit in order to detect faults of said electronic circuit corresponding to an output pattern of said electronic circuit, comprising:

counting the number of undetectable faults occurring, at each input pin being in each of candidate states 0 and 1 of said XOR gates when each of said XOR gates becomes a D frontier (different frontier) or a J frontier (justify frontier);

selecting a state in which the number of undetectable faults is smaller from said candidate states 0 and 1 as an allocating state to a respective input pin, based on a counted result at said counting by selecting the candidate state 1 as the allocating state to be allocated to each said input pin when the number of unpredictable faults at each said input pin and the candidate state 0 is larger than that in the candidate state 1 and selecting the candidate state 0 as the allocating state to be allocated to each said input pin when the number of unpredictable faults at each said input pin in the candidate state 1 is larger than that of the candidate state 0;

holding states at plural kinds of time planes at said NSLs respectively; and generating said test pattern in order that write operation is made to execute at the oldest time plane selected in the step of selecting.

5. The test pattern generating method according to claim 4, wherein:

said generating comprising:

implying an ON value from a clock terminal of a focused NSL being one NSL in said plural NSLs; and recognizing that exclusiveness exists between said focused NSL which implies said ON value and an NSL to which an OFF value reaches, in case that an NSL which an OFF value reaches to its clock terminal exists in NSLs except said focused NSL in said plural NSLs.

6. A test pattern generating apparatus for an electronic circuit having XOR gates, in which a test pattern is generated for supplying said electronic circuit in order to detect faults of said electronic circuit corresponding to an output pattern of said electronic circuit, comprising:

a counting section counting the number of undetectable faults occurring, at each input pin being in each of candidate states 0 and 1 of said XOR gates when each of said XOR gates becomes a D frontier or a J frontier;

a selecting section selecting a state in which the number of detectable faults is smaller from said candidate states 0 and 1 as an allocating state to a respective input pin, based on a counted result at said counting by selecting the candidate state 1 as the allocating state to be allocated to each said input pin when the number of unpredictable faults at each said input pin and the candidate state 0 is larger than that in the candidate state 1 and selecting the candidate state 0 as the allocating state to be allocated to each said input pin when the number of unpredictable faults at each said input pin in the candidate state 1 is larger than that of the candidate state 0; and a test pattern generating section generating said test pattern based on a selected state at said selecting section.

7. A test pattern generating apparatus for an electronic circuit having plural NSLs (no scan latches) that have exclusiveness with respect to "write", in which a test pattern is generated for supplying said electronic circuit in order to detect faults of said electronic circuit corresponding to an output pattern of said electronic circuit, comprising:

a holding section holding states at plural kinds of time planes at said NSLs respectively; and a selecting section selecting an oldest time plane by retrieving in the past time planes satisfying a request at time "t" by retrieval from states at said plural kinds of time planes held at said holding, when each of said NSLs becomes a J frontier at time "t";

a test pattern generating section generating said test pattern in order that write operation is made to execute at the oldest time plane selected by the selecting section.

8. The test pattern generating apparatus according to claim 7, wherein:

said test pattern generating section implies an ON value from a clock terminal of a focused NSL being one NSL in said plural NSLs, and recognizes that exclusiveness exists between said focused NSL which implies said ON value and an NSL which an OFF value reaches, in case that an NSL which an OFF value reaches to its clock terminal exists in NSLs except said focused NSL in said plural NSLs.

9. A test pattern generating apparatus for an electronic circuit having plural NSLs (no scan latches) that have exclusiveness with respect to "write" and having XOR gates, in which a test pattern is generated for supplying said electronic circuit in order to detect faults of said electronic circuit corresponding to an output pattern of said electronic circuit, comprising:

a counting section counting the number of detectable faults occurring, at each input pin being in each of candidate states 0 and 1 of said XOR gates when each of said XOR gates becomes a D frontier or a J frontier;

a selecting section selecting a state in which the number of detectable faults is smaller from said candidate states 0 and 1 as an allocating state to a respective input pin, based on a counted result at said counting by selecting the candidate state 1 as the allocating state to be allocated to each said input pin when the number of unpredictable faults at each said input pin and the candidate state 0 is larger than that in the candidate state 1 and selecting the candidate state 0 as the allocating state to be allocated to each said input pin when the number of unpredictable faults at each said input pin in the candidate state 1 is larger than that of the candidate state 0;

a holding section holding states at plural kinds of time planes at said NSLs respectively;

selecting an oldest time plane by retrieving in the past time planes satisfying a request at time "t" by retrieval from states at said plural kinds of time planes held at said holding, when each of said NSLs becomes a J frontier at time "t";

the selecting section selecting an oldest time plane by retrieving in the past time planes satisfying a request at time "t" by retrieval from states at said plural kinds of time planes held at said holding, when each of said NSLs becomes a J frontier at time "t"; and a test pattern generating section generating said test pattern in order that write operation is made to execute at the oldest time plane selected by the selecting section.

10. The test pattern generating apparatus according to claim 9, wherein:

said test pattern generating section implies an ON value from a clock terminal of a focused NSL being one NSL in said plural NSLs, and recognizes that exclusiveness exists between said focused NSL which implies said ON value and an NSL which an OFF value reaches, in case that an NSL which an OFF value reaches to its clock terminal exists in NSLs except said focused NSL in said plural NSLs.

11. A storing medium stored with a test pattern generating program being readable by a computer for making said computer execute a function generating a test pattern for an electronic circuit having XOR gates, in which a test pattern is generated for supplying said electronic circuit in order to detect faults of said electronic circuit corresponding to an output pattern of said electronic circuit, wherein said test pattern generating program makes said computer execute processes comprising:

counting the number of undetectable faults occurring, at each input pin being in each of candidate states 0 and 1 of said XOR gates when each of said XOR gates becomes a D frontier or a J frontier;

selecting a state in which the number of undetectable faults is smaller from said candidate states 0 and 1 as an allocating state to a respective input pin, based on a counted result at said counting by selecting the candidate state 1 as the allocating state to be allocated to each said input pin when the number of unpredictable faults at each said input pin and the candidate state 0 is larger than that in the candidate state 1 and selecting the candidate state 0 as the allocating state to be allocated to each said input pin when the number of unpredictable faults at each said input pin in the candidate state 1 is larger than that of the candidate state 0; and generating said test pattern based on a selected state at said selecting.

12. A storing medium stored with a test pattern generating program being readable by a computer for making said computer execute a function generating a test pattern for an electronic circuit having plural NSLs (no scan latches) that have exclusiveness with respect to "write", in which a test pattern is generated for supplying said electronic circuit in order to detect faults of said electronic circuit corresponding to an output pattern of said electronic circuit, wherein said test pattern generating program makes said computer execute processes comprising:

holding states at plural kinds of time planes at said NSLs respectively;

selecting an oldest time plane by retrieving in the past time planes satisfying a request at time "t" by retrieval from states at said plural kinds of time planes held at said holding, when each of said NSLs becomes a J frontier at time "t"; and generating said test pattern in order that write operation is made to execute at the oldest time plane selected in the step of selecting.

13. The storing medium stored with the test pattern generating program being readable by a computer according to claim 12, wherein said test pattern generating program, when said computer is made to execute said generating, makes said computer execute processing comprising:

implying an ON value from a clock terminal of a focused NSL being one NSL in said plural NSLs; and recognizing that exclusiveness exists between said focused NSL which implies said ON value and an NSL which an OFF value reaches, in case that an NSL which an OFF value reaches to its clock terminal exists in NSLs except said focused NSL in said plural NSLs.

14. A storing medium stored with a test pattern generating program being readable by a computer for making said computer execute a function generating a test pattern for an electronic circuit having plural NSLs (no scan latches) that have exclusiveness with respect to "write" and having XOR gates, in which a test pattern is generated for supplying said electronic circuit in order to detect faults of said electronic circuit corresponding to an output pattern of said electronic circuit, wherein said test pattern generating program makes said computer execute processes comprising:

counting the number of undetectable faults occurring, at each input pin being in each of candidate states 0 and 1 of said XOR gates when each of said XOR gates becomes a D frontier or a J frontier;

selecting a state in which the number of undetectable faults is smaller from said candidate states 0 and 1 as an allocating state to a respective input pin, based on a counted result at said counting by selecting the candidate state 1 as the allocating state to be allocated to each said input pin when the number of unpredictable faults at each said input pin and the candidate state 0 is larger than that in the candidate state 1 and selecting the candidate state 0 as the allocating state to be allocated to each said input pin when the number of unpredictable faults at each said input pin in the candidate state 1 is larger than that of the candidate state 0;

holding states at plural kinds of time planes at said NSLs respectively;

selecting an oldest time plane by retrieving in the past time planes satisfying a request at time "t" by retrieval from states at said plural kinds of time planes held at said holding, when each of said NSLs becomes a J frontier at time "t"; and generating said test pattern in order that write operation is made to execute at the oldest time plane selected in the step of selecting.

15. The storing medium stored with the test pattern generating program being readable by a computer according to claim 14, wherein said test pattern generating program, when said computer is made to execute said generating, makes said computer execute processes comprising:

implying an ON value from a clock terminal of a focused NSL being one NSL in said plural NSLs; and recognizing that exclusiveness exists between said focused NSL which implies said ON value and an NSL which an OFF value reaches, in case that an NSL which an OFF value reaches to its clock terminal exists in NSLs except said focused NSL in said plural NSLs.

16. A method comprising:

for each XOR gate of an electronic circuit that becomes a D frontier (different frontier) or a J frontier (justify frontier), counting a number of undetectable faults occurring, at each input pin being in each of candidate states 0 and 1 of said XOR gates when each of said XOR gates becomes a D frontier or a J frontier;

selecting a state in which the number of undetectable faults is smaller from said candidate states 0 and 1 as an allocating state to a respective input pin, based on a counted result at said counting by selecting the candidate state 1 as the allocating state to be allocated to each said input pin when the number of unpredictable faults at each said input pin and the candidate state 0 is larger than that in the candidate state 1 and selecting the candidate state 0 as the allocating state to be allocated to each said input pin when the number of unpredictable faults at each said input pin in the candidate state 1 is larger than that of the candidate state 0; and generating a test pattern for the electronic circuit based on the selected states in order to detect faults of the electronic circuit.

17. An apparatus comprising:

for each XOR gate of an electronic circuit that becomes a D frontier (different frontier) or a J frontier (justify frontier), means for counting a number of undetectable faults occurring, at each input pin being in each of candidate states 0 and 1 of said XOR gates when each of said XOR gates becomes a D frontier or a J frontier;

means for selecting a state in which the number of undetectable faults is smaller from said candidate states 0 and 1 as an allocating state to a respective input pin, based on a counted result at said counting by selecting the candidate state 1 as the allocating state to be allocated to each said input pin when the number of unpredictable faults at each said input pin and the candidate state 0 is larger than that in the candidate state 1 and selecting the candidate state 0 as the allocating state to be allocated to each said input pin when the number of unpredictable faults at each said input pin in the candidate state 1 is larger than that of the candidate state 0; and means for generating a test pattern for the electronic circuit based on the selected states in order to detect faults of the electronic circuit.

* * * * *